United States Patent
Lewis, II et al.

(10) Patent No.: US 9,420,727 B2
(45) Date of Patent: Aug. 16, 2016

(54) ELECTRONIC EQUIPMENT ENCLOSURE

(71) Applicant: CHATSWORTH PRODUCTS, INC., Westlake Village, CA (US)

(72) Inventors: Richard Evans Lewis, II, Austin, TX (US); William Drew Krietzman, Castle Rock, CO (US)

(73) Assignee: Chatsworth Products, Inc., Westlake Village, CA (US)

(*) Notice: Subject to any disclaimer, the term of this patent is extended or adjusted under 35 U.S.C. 154(b) by 0 days.

(21) Appl. No.: 14/726,543

(22) Filed: May 31, 2015

(65) Prior Publication Data
US 2015/0264839 A1 Sep. 17, 2015

Related U.S. Application Data

(63) Continuation of application No. 14/574,273, filed on Dec. 17, 2014, now Pat. No. 9,351,427.

(60) Provisional application No. 61/917,347, filed on Dec. 17, 2013.

(51) Int. Cl.
*H05K 5/00* (2006.01)
*H05K 7/20* (2006.01)
(Continued)

(52) U.S. Cl.
CPC .......... *H05K 7/20754* (2013.01); *H05K 5/0004* (2013.01); *H05K 5/0213* (2013.01);
(Continued)

(58) Field of Classification Search
CPC .... A47B 47/00; A47B 47/0025; A47B 47/03; A47B 57/08; A47B 57/20; H05K 5/0217; H05K 7/18
USPC ........................................... 312/265.1–265.4
See application file for complete search history.

(56) References Cited

U.S. PATENT DOCUMENTS

| 2,091,549 A | 8/1937 | Kelso |
| 2,330,769 A | 9/1943 | Wichner |

(Continued)

FOREIGN PATENT DOCUMENTS

| GB | 2366084 B | 9/2002 |
| WO | 2006055506 A2 | 5/2006 |
| WO | 2009089008 A2 | 7/2009 |

OTHER PUBLICATIONS

"Product Catalog" for Rack Technologies Pty Ltd, Internet Web Page <http://racktechnologies.com.au/files/rt2005.pdf>, Jun. 16, 2005, retrieved from Internet Archive Wayback Machine <http://web.archive.org/web/20050616212856/http:// racktechnologies.com.au/files/rt2005.pdf> as reviewed as of Apr. 29, 2016 (73 pages).

*Primary Examiner* — Daniel Rohrhoff
(74) *Attorney, Agent, or Firm* — Tillman Wright, PLLC; James D. Wright; David R. Higgins

(57) ABSTRACT

An electronic equipment enclosure includes a frame structure and a customizable side air dam kit. The frame structure includes a front frame, a rear frame, front-to-back frame members connecting corners of the front and rear frames together, reinforced bracket structures located near ends of the cross members, and extruded horizontal mounting rails parallel to, but inward from, the front-to-back frame members. The ends of the horizontal mounting rails are connected to the reinforced bracket structures. Panels are installed in longitudinal slots in the front-to-back frame members and horizontal mounting rails, each of which is extruded. The customizable side air dam kit includes a framework of horizontal and vertical frame pieces, adapted to connect to the frame structure, and a customizable air dam panel supported by the framework. A plurality of the frame pieces are provided to an installer for use in constructing the framework to fit the specific frame structure.

20 Claims, 18 Drawing Sheets

(51) Int. Cl.
*H05K 5/02* (2006.01)
*H05K 7/14* (2006.01)

(52) U.S. Cl.
CPC ............ *H05K5/0217* (2013.01); *H05K 7/1488* (2013.01); *H05K 7/20736* (2013.01); *H05K 7/20836* (2013.01)

(56) References Cited

U.S. PATENT DOCUMENTS

| | | |
|---|---|---|
| 2,424,217 A | 7/1947 | Bales |
| 3,034,844 A | 5/1962 | Anderson et al. |
| 3,265,419 A | 8/1966 | Durnbaugh et al. |
| 3,274,451 A | 9/1966 | Laity |
| 3,404,931 A | 10/1968 | Fall et al. |
| 3,563,627 A | 2/1971 | Whipps |
| 3,640,389 A | 2/1972 | Snyder |
| 3,655,254 A | 4/1972 | Mayer et al. |
| 4,643,319 A | 2/1987 | Debus et al. |
| 4,796,541 A | 1/1989 | Halstrick |
| 4,814,942 A | 3/1989 | Robirds et al. |
| 4,852,317 A | 8/1989 | Schiavello et al. |
| 4,988,008 A | 1/1991 | Blum et al. |
| 5,004,107 A | 4/1991 | Sevier et al. |
| RE34,393 E | 9/1993 | McIlwraith |
| 5,250,752 A | 10/1993 | Cutright |
| 5,275,296 A | 1/1994 | Zachrai |
| 5,310,255 A | 5/1994 | Ranallo |
| 5,380,083 A | 1/1995 | Jones et al. |
| 5,463,966 A | 11/1995 | Nilsson |
| 5,498,073 A | 3/1996 | Charbonneau et al. |
| 5,639,150 A * | 6/1997 | Anderson ............ A47B 96/145 312/265.2 |
| 5,655,821 A | 8/1997 | Laboch et al. |
| 5,695,263 A | 12/1997 | Simon et al. |
| 5,769,519 A | 6/1998 | Nicolai |
| 5,791,498 A | 8/1998 | Mills |
| 5,806,945 A | 9/1998 | Anderson et al. |
| 5,833,084 A | 11/1998 | Chang |
| 5,938,302 A | 8/1999 | Anderson et al. |
| 6,003,273 A | 12/1999 | Elsholz et al. |
| 6,019,446 A | 2/2000 | Laboch et al. |
| 6,036,290 A | 3/2000 | Jancsek et al. |
| 6,179,398 B1 | 1/2001 | Martin |
| 6,238,029 B1 | 5/2001 | Marzec et al. |
| 6,254,207 B1 | 7/2001 | Leneutre |
| 6,293,637 B1 * | 9/2001 | Anderson ............... H02B 1/301 211/26 |
| 6,299,268 B1 | 10/2001 | Carle et al. |
| 6,305,556 B1 | 10/2001 | Mayer |
| 6,315,132 B1 | 11/2001 | Hartel et al. |
| 6,419,331 B2 | 7/2002 | Wei |
| 6,422,399 B1 | 7/2002 | Castillo et al. |
| 6,428,127 B1 | 8/2002 | Rasmussen |
| 6,478,166 B2 | 11/2002 | Hung |
| 6,516,955 B1 | 2/2003 | Dudhwala et al. |
| 6,591,997 B2 | 7/2003 | Hung |
| 6,601,932 B1 | 8/2003 | Helgenberg et al. |
| 6,605,777 B1 | 8/2003 | Anderson et al. |
| 6,655,533 B2 * | 12/2003 | Guebre-Tsadik ...... H05K 7/186 211/175 |
| 6,695,149 B1 | 2/2004 | Cote et al. |
| 6,788,535 B2 | 9/2004 | Dodgen et al. |
| 6,796,437 B2 | 9/2004 | Krampotich et al. |
| 6,814,417 B2 | 11/2004 | Hartel et al. |
| 6,863,188 B2 | 3/2005 | Besserer et al. |
| 6,883,879 B2 | 4/2005 | Latchinian |
| 6,945,616 B2 | 9/2005 | Webster et al. |
| 6,974,037 B2 | 12/2005 | Haney |
| 7,033,267 B2 | 4/2006 | Rasmussen |
| 7,112,131 B2 | 9/2006 | Rasmussen et al. |
| 7,293,666 B2 | 11/2007 | Mattlin et al. |
| 7,364,243 B2 | 4/2008 | Wyatt et al. |
| 7,425,678 B2 | 9/2008 | Adducci et al. |
| 7,427,713 B2 | 9/2008 | Adducci et al. |
| 7,472,970 B2 | 1/2009 | Bergesch et al. |
| 7,476,804 B2 | 1/2009 | Adducci et al. |
| 7,485,803 B2 | 2/2009 | Adducci et al. |
| 7,495,169 B2 | 2/2009 | Adducci et al. |
| 7,498,512 B2 | 3/2009 | Adducci et al. |
| 7,504,581 B2 | 3/2009 | Adducci et al. |
| 7,506,768 B2 | 3/2009 | Rassmussen et al. |
| 7,592,541 B2 | 9/2009 | Adducci et al. |
| 7,608,779 B2 | 10/2009 | Adducci et al. |
| 7,643,291 B2 | 1/2010 | Mallia et al. |
| 7,667,135 B2 | 2/2010 | Adducci et al. |
| 7,718,891 B2 | 5/2010 | Adducci et al. |
| 7,764,495 B2 | 7/2010 | Hruby et al. |
| 7,772,489 B2 | 8/2010 | Adducci et al. |
| 7,781,675 B2 | 8/2010 | Adducci et al. |
| 7,795,532 B2 | 9/2010 | Walker |
| 7,874,433 B2 | 1/2011 | Levesque et al. |
| 7,878,888 B2 | 2/2011 | Rasmussen et al. |
| 7,880,084 B2 | 2/2011 | Adducci et al. |
| 7,974,105 B2 | 7/2011 | Dean, Jr. et al. |
| 8,024,839 B2 | 9/2011 | Lewis, II |
| 8,035,965 B2 | 10/2011 | Adducci et al. |
| 8,087,979 B2 | 1/2012 | Rasmussen |
| 8,237,052 B2 | 8/2012 | Adducci et al. |
| 8,257,155 B2 | 9/2012 | Lewis, II |
| 8,281,940 B2 | 10/2012 | Fan |
| 8,317,274 B2 * | 11/2012 | Hsiao ..................... H05K 7/18 312/223.1 |
| 8,395,046 B2 | 3/2013 | Nicewicz et al. |
| 8,403,736 B2 | 3/2013 | Rasmussen et al. |
| 8,411,465 B2 | 4/2013 | Dean, Jr. et al. |
| 8,437,147 B2 | 5/2013 | Dean, Jr. et al. |
| 8,459,756 B2 | 6/2013 | Linhares et al. |
| 8,768,169 B2 | 7/2014 | Yuan |
| 8,787,023 B2 | 7/2014 | Lewis, II et al. |
| 8,901,438 B2 | 12/2014 | Lewis, II et al. |
| 9,055,677 B2 | 6/2015 | Garza, Jr. et al. |
| 2002/0046979 A1 | 4/2002 | Larsen et al. |
| 2002/0117462 A1 | 8/2002 | Hung |
| 2002/0172013 A1 | 11/2002 | Chandler |
| 2002/0195029 A1 | 12/2002 | Walton |
| 2004/0016708 A1 | 1/2004 | Rafferty et al. |
| 2004/0183409 A1 | 9/2004 | Rinderer |
| 2005/0103734 A1 | 5/2005 | Saltzberg et al. |
| 2006/0103270 A1 | 5/2006 | Bergesch et al. |
| 2007/0171610 A1 | 7/2007 | Lewis |
| 2007/0173189 A1 | 7/2007 | Lewis |
| 2007/0210679 A1 | 9/2007 | Adducci et al. |
| 2007/0210680 A1 | 9/2007 | Appino et al. |
| 2007/0210681 A1 | 9/2007 | Adducci et al. |
| 2007/0210683 A1 | 9/2007 | Adducci et al. |
| 2007/0210686 A1 | 9/2007 | Adducci et al. |
| 2007/0220708 A1 | 9/2007 | Lewis |
| 2007/0221393 A1 | 9/2007 | Adducci et al. |
| 2007/0293138 A1 | 12/2007 | Adducci et al. |
| 2008/0062654 A1 | 3/2008 | Mattlin et al. |
| 2008/0067904 A1 | 3/2008 | Adducci et al. |
| 2008/0074849 A1 | 3/2008 | Adducci et al. |
| 2008/0174217 A1 * | 7/2008 | Walker ................... H05K 7/186 312/329 |
| 2008/0266789 A1 | 10/2008 | Hruby et al. |
| 2009/0061755 A1 | 3/2009 | Calder et al. |
| 2009/0273915 A1 | 11/2009 | Dean, Jr. et al. |
| 2011/0211328 A1 | 9/2011 | Dean, Jr. et al. |
| 2011/0211329 A1 | 9/2011 | Dean, Jr. et al. |
| 2011/0271610 A1 | 11/2011 | Cottuli et al. |
| 2011/0278999 A1 | 11/2011 | Caveney et al. |
| 2012/0062083 A1 | 3/2012 | Lewis, II et al. |
| 2012/0062084 A1 | 3/2012 | Lewis, II et al. |
| 2012/0062086 A1 | 3/2012 | Garza, Jr. et al. |
| 2012/0062091 A1 | 3/2012 | Donowho et al. |
| 2012/0063099 A1 | 3/2012 | Alaniz et al. |
| 2012/0267991 A1 | 10/2012 | Adducci et al. |
| 2013/0069501 A1 * | 3/2013 | Liu ......................... H05K 7/18 312/223.1 |
| 2013/0210335 A1 | 8/2013 | Krietzman et al. |
| 2014/0034593 A1 | 2/2014 | Chen et al. |
| 2014/0132134 A1 | 5/2014 | Garza, Jr. et al. |
| 2014/0196394 A1 * | 7/2014 | Greeson ............... H05K 7/1497 |

(56) References Cited

U.S. PATENT DOCUMENTS

| | | | |
|---|---|---|---|
| 2014/0319084 A1 | 10/2014 | Lewis, II et al. | |
| 2015/0173253 A1* | 6/2015 | Lewis, II | H05K 5/0004 312/223.2 |
| 2015/0250071 A1 | 9/2015 | Garza, Jr. et al. | 52/404.2 |
| 2015/0282390 A1 | 10/2015 | Lewis, II et al. | |
| 2015/0333303 A1* | 11/2015 | Hachiya | H01M 2/1077 429/90 |
| 2015/0342082 A1* | 11/2015 | Roehrl | H05K 7/183 211/26 |
| 2016/0088773 A1 | 3/2016 | Greeson et al. | |

\* cited by examiner

FIG. 20
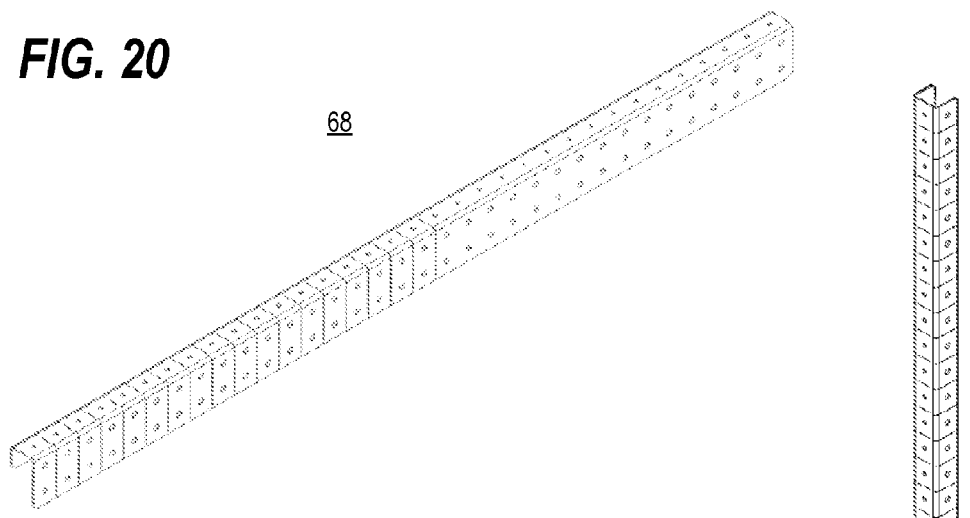
68
66
FIG. 21
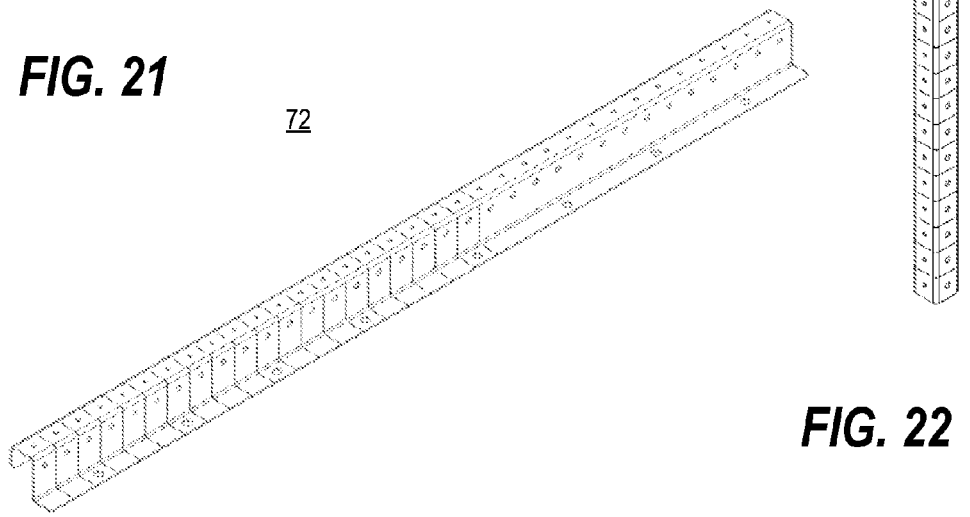
72
FIG. 22

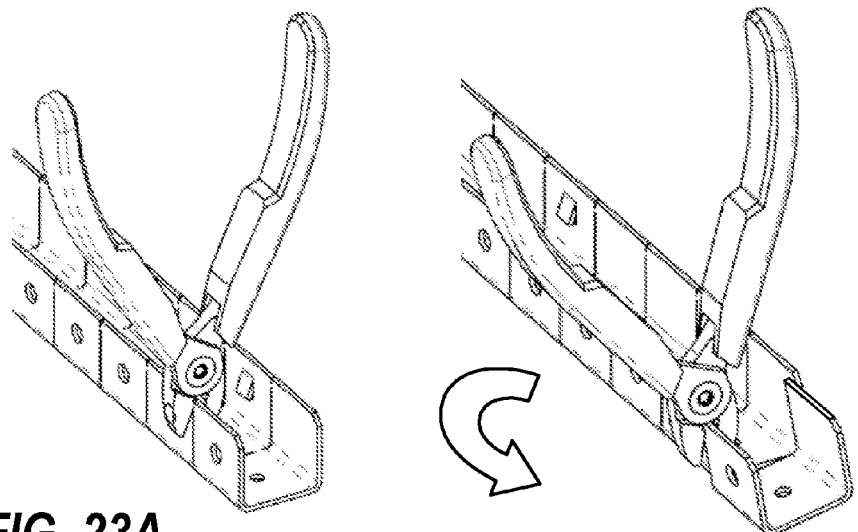
FIG. 23A
FIG. 23C
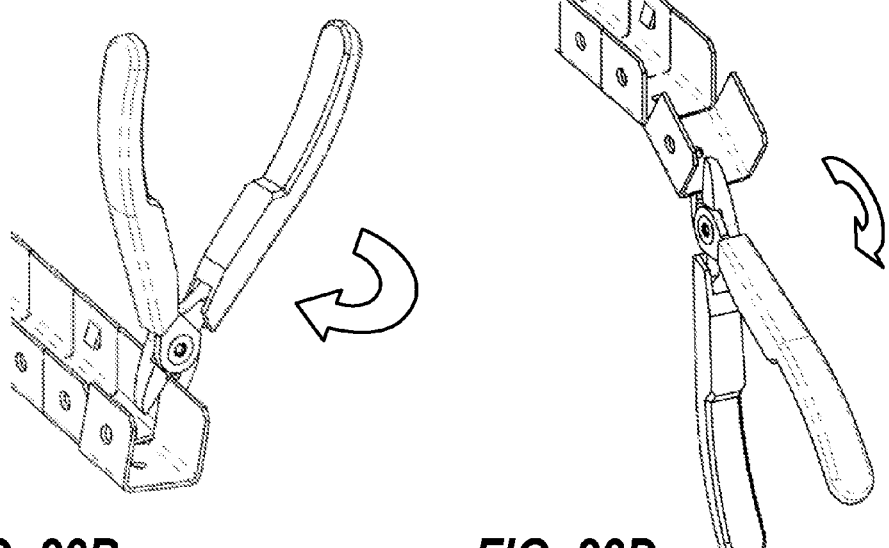
FIG. 23B
FIG. 23D

ELECTRONIC EQUIPMENT ENCLOSURE

CROSS REFERENCE TO RELATED APPLICATION

The present application is a U.S. continuation patent application of, and claims priority under 35 U.S.C. §120 to, U.S. non-provisional patent application Ser. No. 14/574,273, filed Dec. 17, 2014, entitled "ELECTRONIC EQUIPMENT ENCLOSURE," and published as U.S. Patent Application Publication No. US 2015/0173253 A1 on Jun. 18, 2015, which '273 application and said publication are incorporated herein by reference, and which '273 application is a U.S. non-provisional patent application of, and claims priority under 35 U.S.C. §119(e) to, U.S. provisional patent application Ser. No. 61/917,347, filed Dec. 17, 2013 and entitled "ELECTRONIC EQUIPMENT ENCLOSURE," which '347 application is incorporated herein by reference.

COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

BACKGROUND OF THE PRESENT INVENTION

1. Field of the Present Invention

The present invention generally relates to air flow management within an electronic equipment enclosure, and in particular to, a side-to-side airflow control system to promote cooling of server equipment that utilizes side-to-side airflow.

2. Background

Racks, frames, cabinets and the like for supporting computer and other electronic equipment are well known. Such support apparatuses are often partially or fully enclosed, either directly through the use of doors and panels mounted directly thereon, or indirectly by lining several such apparatuses up in a row such that the sides of each rack are immediately adjacent another rack.

As is also well known, the electronic equipment mounted therein tends to generate large amounts of heat that need to be exhausted away from the equipment effectively in order to maintain the equipment in proper operating order or to prevent damage thereto. As equipment has become more densely packed with electronics, the quantities of heat have continued to increase in recent years. Heat management has thus become a significant issue confronting today's rack, cabinet, frame and enclosure manufacturers, the manufacturers of the electronic equipment, and the users of such equipment.

Each piece of equipment is often enclosed within an individual chassis or housing that includes a location, typically referred to as an exhaust grille, where air that has been circulated therethrough is exhausted. The heated air is frequently forced or forcibly drawn out of the various active pieces of equipment through exhaust grilles of the equipment by internal fans, often supplemented by separate fans mounted in or on the enclosure. In many pieces of equipment, the exhaust grille is located on the rear of the equipment, and the equipment is often cooled by bringing cool air to the front of the equipment and exhausted through the rear, often through a door or through exhaust openings in a panel. Other equipment uses the opposite configuration, wherein cool air is brought to the rear of the equipment and exhausted through the front; this may be handled generally similarly as the rear exhaust except that the front and rear of the cabinet are generally reversed.

However, other equipment is arranged to receive cold air from the side and to exhaust heated air from the opposite side. For example, a common piece of electronic equipment in modern computer networks is a switch. Switches tend to generate a significant amount of heat, and therefore are of particular concern in exhausting heat from an electronic equipment enclosure, and at least some are manufactured with inlets on one side and exhaust grilles on the other side. Such equipment requires different treatment than front/rear exhaust equipment.

Currently, in order to remove heated switch exhaust air from the side of an electronic equipment enclosure, the switch exhaust grille is coupled with or connected to an individual exhaust duct that is specifically designed and sized to fit the particular type of switch being used. It is important that the switch grille and the exhaust duct inlet are similarly sized so that exhaust air is routed outside of the enclosure through the duct rather than being released into the interior of the enclosure where it would adversely affect the equipment stored therein. Because of the individual sizing, a different exhaust duct must be used for differently sized switches.

One solution has been presented in commonly-assigned U.S. patent application Ser. No. 12/123,453, filed May 19, 2008 and published Dec. 25, 2008 as US 2008/0316702 A1 (the "'453 application"), which is incorporated herein by reference. In particular, adjustable filler panels are disclosed for more precisely controlling airflow above and below side inlets and outlets in certain types of side-to-side equipment. However, such an arrangement presents only a partial solution. In particular, such an arrangement does not work well with exhaust ducts located at the top of the enclosure, particularly on the top panel thereof.

One improved solution has been presented in U.S. Pat. No. 7,957,139, issued Jun. 7, 2011 to Davis et al, but other improvements are believed to be useful, including improvements related to greater customization, improved frame strength, convenience of construction, and the like. Thus, a more versatile, adjustable solution is needed.

SUMMARY OF THE PRESENT INVENTION

Broadly defined, the present invention according to one aspect is an electronic equipment enclosure, including: a frame structure, the frame structure including a plurality of vertical frame members and a plurality of side-to-side cross members; a pair of front-to-back members constructed of extruded metal and connected to the frame structure at a top or bottom thereof, each front-to-back member including at least a first longitudinal slot disposed in one of its lateral sides and extending along its length, wherein the respective lateral sides, in which the slots are disposed, face one another; and a generally planar, horizontal, partition structure having opposed edges that are received in, and supported by, the facing longitudinal slots in the extruded front-to-back members.

In a feature of this aspect, the partition structure is an enclosure panel.

In another feature of this aspect, the partition structure is a brush assembly.

In another feature of this aspect, the partition structure is located at the top thereof.

In another feature of this aspect, the partition structure is located at the bottom thereof.

In another feature of this aspect, one of the front-to-back members is a frame member of the electronic equipment enclosure, and the other of the front-to-back members is a horizontal mounting rail in the electronic equipment enclosure.

In another feature of this aspect, the front-to-back members are both horizontal mounting rails in the electronic equipment enclosure.

In another feature of this aspect, the opposed edges of the partition structure include reinforced portions, and wherein the reinforced portions are received in the longitudinal slots.

In another feature of this aspect, each longitudinal slot has contours that retain the respective edge of the partition structure. In further features, the longitudinal slot has a T-shaped cross-section; and/or the longitudinal slot has an L-shaped cross-section.

In another feature of this aspect, one or more clip is inserted into each longitudinal slot, adjacent the respective edge of the partition structure, to retain the panel in the slot. In further features, the each clip has edges and contours that interact with edges and contours of the respective longitudinal slot to retain the panel in the slot; and/or each clip is adjustable between a retention state and a release state, and wherein each clip is biased into the retention state.

In another feature of this aspect, at least one of the front-to-back members further includes at least a second longitudinal slot disposed on the lateral side opposite the lateral side in which the first longitudinal slot is disposed.

Broadly defined, the present invention according to another aspect is a horizontal panel assembly for use at the top or bottom of an electronic equipment enclosure, including: a pair of front-to-back members constructed of extruded metal, each including at least a first longitudinal slot disposed in one of its lateral sides and extending along its length, wherein the respective lateral sides, in which the slots are disposed, face one another; and a panel having opposed edges that are received in, and supported by, the facing longitudinal slots in the extruded front-to-back members.

In a feature of this aspect, the panel assembly is disposed in the top or bottom of an electronic equipment enclosure. In further features, one of the front-to-back members is a frame member of the electronic equipment enclosure, and the other of the front-to-back members is a horizontal mounting rail in the electronic equipment enclosure; and/or the front-to-back members are horizontal mounting rails in the electronic equipment enclosure.

In another feature of this aspect, the opposed edges of the panel include reinforced portions, and wherein the reinforced portions are received in the longitudinal slots.

In another feature of this aspect, each longitudinal slot has contours that retain the respective edge of the panel. In further features, the longitudinal slot has a T-shaped cross-section; and/or the longitudinal slot has an L-shaped cross-section.

In another feature of this aspect, a plurality of clips are inserted into each longitudinal slot, adjacent the respective edge of the panel, to retain the panel in the slot. In further features, the clips have edges and contours that interact with edges and contours of the respective longitudinal slot to retain the panel in the slot; and/or each clip is adjustable between a retention state and a release state, and wherein each clip is biased into the retention state.

In another feature of this aspect, at least one of the front-to-back members further includes at least a second longitudinal slot disposed on the lateral side opposite the lateral side in which the first longitudinal slot is disposed.

Broadly defined, the present invention according to another aspect is an electronic equipment enclosure, including: a front frame, including a first pair of vertical frame members, a first upper side-to-side cross member, and a first lower side-to-side cross member; a rear frame, including a second pair of vertical frame members, a second upper side-to-side cross member, and a second lower side-to-side cross member; a pair of front-to-back horizontal frame members, each front-to-back frame member constructed of extruded metal, connected to the front frame at the top thereof, and including at least a first longitudinal slot disposed in one of its lateral sides and extending along its length; a pair of front-to-back horizontal mounting rails, each mounting rail constructed of extruded metal, supported by the front and rear frames at the top thereof, and including a second longitudinal slot disposed in one of its lateral sides and extending along its length, wherein the front-to-back horizontal mounting rails and the front-to-back horizontal frame members are all parallel to each other and co-planar with each other, and wherein each horizontal mounting rail faces a respective horizontal frame member such that the first longitudinal slot disposed in the lateral side of the horizontal frame member faces the second longitudinal slot disposed in the lateral side of the respective horizontal mounting rail; and a pair of partition structures, each having opposed edges that are received in, and supported by, the facing longitudinal slots in a respective combination of a front-to-back horizontal mounting rail and a front-to-back horizontal frame member.

In a feature of this aspect, each partition structure is an enclosure panel.

In another feature of this aspect, each partition structure is a brush assembly.

Broadly defined, the present invention according to another aspect is a horizontal panel assembly for use at the top or bottom of an electronic equipment enclosure, including: a front-to-back member constructed of extruded metal, including at least a longitudinal slot, having a sideways T-shaped cross-section, disposed in one of its lateral sides and extending along its length; a horizontal enclosure panel having an edge that is positioned with the T-shaped longitudinal slot, wherein the edge has a sideways T-shaped cross-section that hooks over a portion of the T-shaped longitudinal slot; and a plurality of clips, each clip being inserted into the longitudinal slot, adjacent the edge of the panel, to retain the panel in the slot.

In a feature of this aspect, the clips have edges and contours that interact with edges and contours of the respective longitudinal slot to retain the panel in the slot.

In another feature of this aspect, each clip is adjustable between a retention state and a release state, and wherein each clip is biased into the retention state.

In another feature of this aspect, each clip includes a first portion that hooks over an edge of the T-shaped edge of the panel, a second portion that is disposed against the side of the T-shaped edge of the panel, and a resilient third portion that may be temporarily deflected to seat the clip within the slot. In further features, each clip further includes a fourth portion abutting the outside of the slot; and/or each clip further includes a distinct fifth portion abutting the inside of the slot.

In another feature of this aspect, the clip is made of plastic.

Broadly defined, the present invention according to another aspect is a frame structure for an electronic equipment enclosure, including: a front frame, including a first pair of vertical frame members, a first upper side-to-side cross member, and a first lower side-to-side cross member; a rear frame, including a second pair of vertical frame members, a second upper side-to-side cross member, and a second lower side-to-side cross member; a pair of front-to-back horizontal frame members connecting upper corners of the front and rear frames together; a pair of front-to-back horizontal frame members connecting lower corners of the front and rear frames together; a first reinforced bracket structure located near a first end of each respective upper and lower side-to-side cross member; a second reinforced bracket structure located near a second, opposite, end of each respective upper and lower side-to-side cross member; a first front-to-back horizontal mounting rail connected at a first end to the reinforced bracket structure near the first end of the lower front side-to-side cross member and at a second end to the reinforced bracket structure near the first end of the lower rear side-to-side cross member such that the first extruded horizontal mounting rail is adjacent to, but inward from, a first front-to-back horizontal frame member; a second front-to-back horizontal mounting rail connected at a first end to the reinforced bracket structure near the second end of the lower front side-to-side cross member and at a second end to the reinforced bracket structure near the second end of the lower rear side-to-side cross member such that the second extruded horizontal mounting rail is adjacent to, but inward from, a second front-to-back horizontal frame member; a third front-to-back horizontal mounting rail connected at a first end to the reinforced bracket structure near the first end of the upper front side-to-side cross member and at a second end to the reinforced bracket structure near the first end of the upper rear side-to-side cross member such that the third extruded horizontal mounting rail is adjacent to, but inward from, a third front-to-back horizontal frame member; and a fourth front-to-back horizontal mounting rail connected at a first end to the reinforced bracket structure near the second end of the upper front side-to-side cross member and at a second end to the reinforced bracket structure near the second end of the upper rear side-to-side cross member such that the fourth extruded horizontal mounting rail is adjacent to, but inward from, a fourth front-to-back horizontal frame member; wherein the first, second, third, and fourth front-to-back horizontal mounting rails are made of extruded metal.

In a feature of this aspect, each reinforced bracket structure includes a tab extending vertically and integrally from the respective side-to-side cross member and interconnected to the end of the respective horizontal mounting rail. In further features, each reinforced bracket structure further includes a brace structure, having a U-shaped cross-section, which includes a first vertical portion that is interconnected to the end of the respective horizontal mounting rail and a pair of side vertical portions that brace the first vertical portion against the respective side-to-side cross member; each side vertical portion of the brace structure includes a tab that resides in a slot in the respective side-to-side cross member; the first vertical portion of the brace structure is disposed between the tab and the end of the respective horizontal mounting rail; the tab and the brace structure of each reinforced bracket structure are fastened to the end of the respective horizontal mounting rail via a fastener connected to a cylindrical slot that is part of the extrusion of the horizontal mounting rail; and/or each reinforced bracket structure further includes a cover disposed around the brace structure.

In another feature of this aspect, each reinforced bracket structure includes a brace structure, having a U-shaped cross-section, which includes a first vertical portion that is interconnected to the end of the respective horizontal mounting rail and a pair of side vertical portions that brace the first vertical portion against the respective side-to-side cross member. In further features, each side vertical portion of the brace structure includes a tab that resides in a slot in the respective side-to-side cross member; and/or the frame structure further includes cover disposed around the brace structure.

Broadly defined, the present invention according to another aspect is a customizable side air dam kit, including: a framework of horizontal and vertical frame pieces adapted to connect to the frame structure of an electronic equipment enclosure; and a customizable air dam panel connected to, and supported by, the framework; wherein a plurality of horizontal and vertical frame pieces are provided to an installer for use in constructing the framework to fit the specific frame structure of a particular electronic equipment enclosure.

In a feature of this aspect, the horizontal and vertical frame pieces are partially cut or scored so as to be cut or broken by the installer to desired lengths. In further features, the cuts or scores are disposed at uniform incremental locations along the horizontal and vertical frame pieces; the vertical frame pieces are cut or scored at 1 RMU increments; the horizontal frame pieces are cut or scored at 25 mm increments; and/or the customizable air dam panel is partially cut or scored so as to be cut or broken by the installer to desired size.

In another feature of this aspect, the customizable air dam panel includes pre-cut apertures that may be punched out at desired locations. In a further feature, the pre-cut apertures are provided at uniform spacings.

In another feature of this aspect, the kit is customized and installed in an electronic equipment enclosure. In further features, the kit is installed along a side of the electronic equipment enclosure so as to at least partially define a side plenum adjacent electronic equipment installed in the enclosure and to block air from flowing over or under the equipment and into or out of the side plenum; the customizable side air dam kit further includes a rear panel assembly extending rearward from the electronic equipment installed in the enclosure to block air from flowing into or out of a rear plenum from or to the side plenum; the rear panel assembly includes a fixed rear panel; the rear panel assembly further includes an adjustable rear panel that may be repositioned relative to the fixed rear panel so as to provide adjustability in the size of the rear panel assembly; and/or the rear panel assembly further includes a filler panel.

Broadly defined, the present invention according to another aspect is an electronic equipment enclosure with a customizable side air dam, including: a frame structure, including: a front frame, including a first pair of vertical frame members, a first upper side-to-side cross member, and a first lower side-to-side cross member, a rear frame, including a second pair of vertical frame members, a second upper side-to-side cross member, and a second lower side-to-side cross member, a pair of front-to-back horizontal frame members connecting upper corners of the front and rear frames together, a pair of front-to-back horizontal frame members connecting lower corners of the front and rear frames together; and a customizable side air dam kit, including: a plurality of horizontal and vertical frame pieces adapted to connect to the frame structure to form a side air dam framework, and a customizable air dam panel connected to, and supported by, the framework, wherein the plurality of horizontal and vertical frame pieces are provided to an installer for use in constructing the framework to fit the specific frame structure of a particular electronic equipment enclosure.

In a feature of this aspect, the horizontal and vertical frame pieces are partially cut or scored so as to be cut or broken by the installer to desired lengths. In further features, the cuts or scores are disposed at uniform incremental locations along the horizontal and vertical frame pieces; the vertical frame pieces are cut or scored at 1 RMU increments; the horizontal frame pieces are cut or scored at 25 mm increments; and/or the customizable air dam panel is partially cut or scored so as to be cut or broken by the installer to desired sizes.

In another feature of this aspect, the customizable air dam panel includes pre-cut apertures that may be punched out at desired locations. In a further feature, the pre-cut apertures are provided at uniform spacings.

In another feature of this aspect, the kit is customized and installed in the electronic equipment enclosure. In further features, the kit is installed along a side of the electronic equipment enclosure so as to at least partially define a side plenum adjacent electronic equipment installed in the enclosure and to block air from flowing over or under the equipment and into or out of the side plenum; the electronic equipment enclosure further includes a rear panel assembly extending rearward from the electronic equipment installed in the enclosure to block air from flowing into or out of a rear plenum from or to the side plenum; the rear panel assembly includes a fixed rear panel; the rear panel assembly further includes an adjustable rear panel that may be repositioned relative to the fixed rear panel so as to provide adjustability in the size of the rear panel assembly; and/or the rear panel assembly further includes a filler panel.

Broadly defined, the present invention according to another aspect is a panel assembly for use in a top or bottom panel assembly of an electronic equipment enclosure, including: a pair of front-to-back members constructed of extruded metal, each including at least one longitudinal slot extending along its length; and a panel having opposed edges that are received in, and supported by, the longitudinal slots in the extruded front-to-back members.

In a feature of this aspect, the panel assembly is disposed in the top or bottom of an electronic equipment enclosure. In further features, one of the front-to-back members is a frame member of the electronic equipment enclosure, and the other of the front-to-back members is a horizontal mounting rail in the electronic equipment enclosure; and/or the front-to-back members are horizontal mounting rails in the electronic equipment enclosure.

In another feature of this aspect, the opposed edges of the panel are reinforced, and wherein the reinforced portions are received in the longitudinal slots.

In another feature of this aspect, a plurality of clips are inserted into each longitudinal slot, adjacent the edge of the panel, to retain the panel in the slot. In a further feature, the clips have edges and contours that interact with edges and contours of the respective longitudinal slot to retain the panel in the slot.

Broadly defined, the present invention according to another aspect is a panel assembly as shown and described.

Broadly defined, the present invention according to another aspect is an electronic equipment enclosure having a top or bottom panel assembly as shown and described.

Broadly defined, the present invention according to another aspect is a clip for a panel assembly as shown and described.

Broadly defined, the present invention according to another aspect is an electronic equipment enclosure system as shown and described.

Broadly defined, the present invention according to another aspect is a frame structure for an electronic equipment enclosure as shown and described.

Broadly defined, the present invention according to another aspect is a frame structure for an electronic equipment enclosure, including: a front frame, including two vertical frame members and two cross members connecting tops and bottoms of the vertical frame members together; a rear frame, including two vertical frame members and two cross members connecting tops and bottoms of the vertical frame members together; front-to-back frame members connecting corners of the front and rear frames together; reinforced bracket structures located near ends of the cross members; and extruded horizontal mounting rails parallel to, but inward from, the front-to-back frame members; wherein ends of the horizontal mounting rails are connected to the reinforced bracket structures.

Broadly defined, the present invention according to another aspect is a frame cross member having a reinforced bracket structure near each end for connecting to a horizontal mounting rail.

Broadly defined, the present invention according to another aspect is a customizable side air dam kit, including: a framework of horizontal and vertical frame pieces adapted to connect to the frame structure of an electronic equipment enclosure; and a customizable air dam panel connected to, and supported by, the framework; wherein a plurality of horizontal and vertical frame pieces are provided to an installer for use in constructing the framework to fit the specific frame structure of a particular electronic equipment enclosure.

In a feature of this aspect, the horizontal and vertical frame pieces are partially cut or scored so as to be cut or broken by the installer to desired lengths.

In another feature of this aspect, the cuts or scores are disposed at uniform incremental locations along the horizontal and vertical frame pieces. In further features, the vertical frame pieces are cut or scored at 1 RMU increments; and/or the horizontal frame pieces are cut or scored at 25 mm increments.

In another feature of this aspect, the customizable air dam panel is partially cut or scored so as to be cut or broken by the installer to desired sizes.

In another feature of this aspect, the customizable air dam panel includes pre-cut apertures that may be punched out at desired locations. In a further feature, the pre-cut apertures are provided at uniform spacings.

In another feature of this aspect, the kit is customized and installed in an electronic equipment enclosure. In further features, the kit is installed along a side of the electronic equipment enclosure so as to at least partially define a side plenum adjacent electronic equipment installed in the enclosure and to block air from flowing over or under the equipment and into or out of the side plenum; the kit further includes a rear panel assembly extending rearward from the electronic equipment installed in the enclosure to block air from flowing into or out of a rear plenum from or to the side plenum; the rear panel assembly includes a fixed rear panel; the rear panel assembly further includes an adjustable rear panel that may be repositioned relative to the fixed rear panel so as to provide adjustability in the size of the rear panel assembly; and/or the rear panel assembly further includes a filler panel.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein:

FIG. 20 is an isometric view of a horizontal air dam frame piece of a type used in the side air dam kit of FIG. 10;

FIG. 21 is an isometric view of another horizontal air dam frame piece of a type used in the side air dam kit of FIG. 10;

FIG. 22 is an isometric view of a vertical air dam frame piece of a type used in the side air dam kit of FIG. 10;

FIGS. 23A-23D are a series of perspective views illustrating a process of cutting a frame piece;

DETAILED DESCRIPTION

Figure 1:
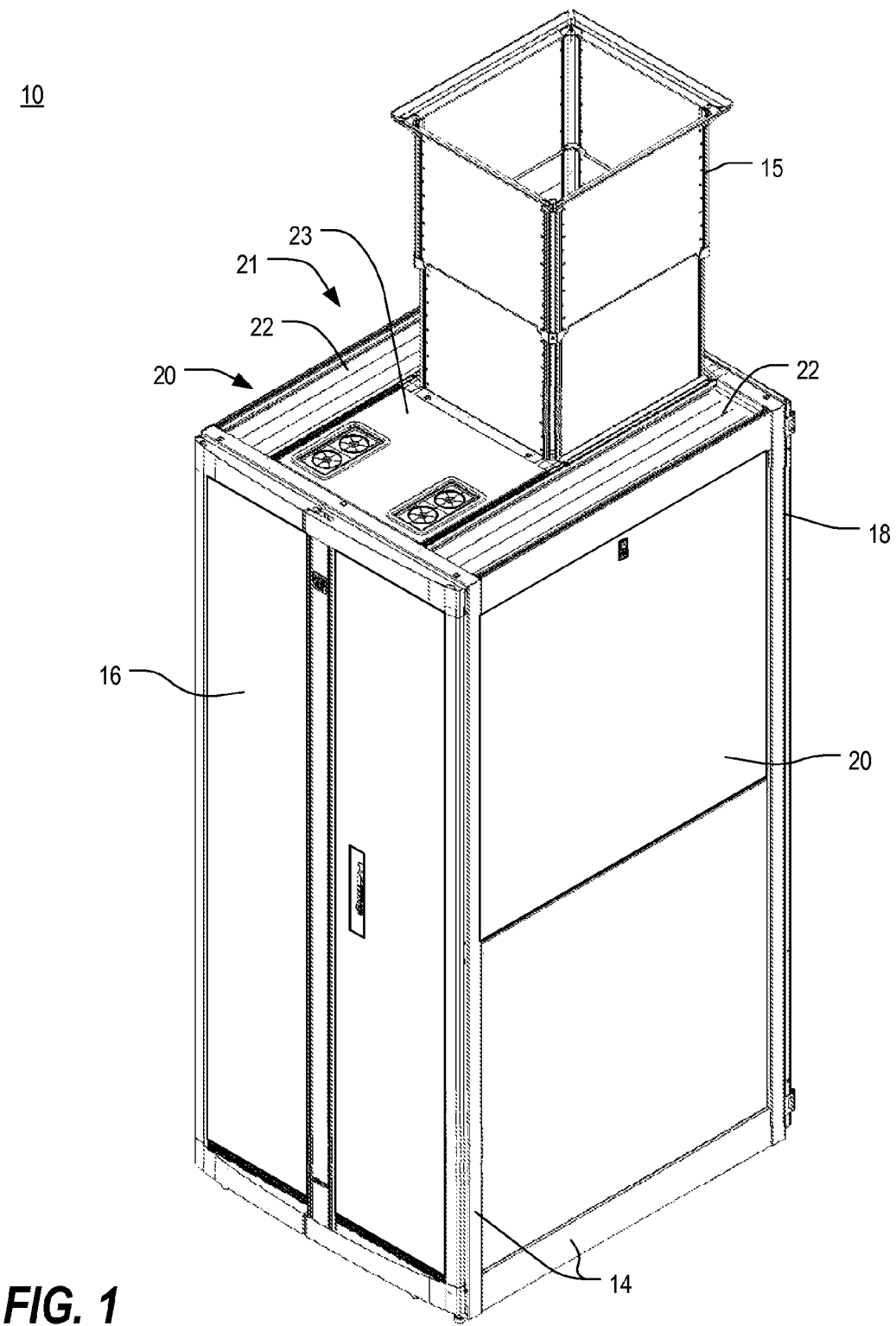
FIG. 1 is an isometric view of an electronic equipment enclosure system in accordance with one or more preferred embodiments of the present invention.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. As should be understood, any embodiment may incorporate only one or a plurality of the above-disclosed aspects of the invention and may further incorporate only one or a plurality of the above-disclosed features. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Regarding applicability of 35 U.S.C. §112, ¶6, no claim element is intended to be read in accordance with this statutory provision unless the explicit phrase "means for" or "step for" is actually used in such claim element, whereupon this statutory provision is intended to apply in the interpretation of such claim element.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers," "a picnic basket having crackers without cheese," and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, one or more preferred embodiments of the present invention are next described. The following description of one or more preferred embodiment(s) is merely exemplary in nature and is in no way intended to limit the invention, its application, or uses.

Figure 2:
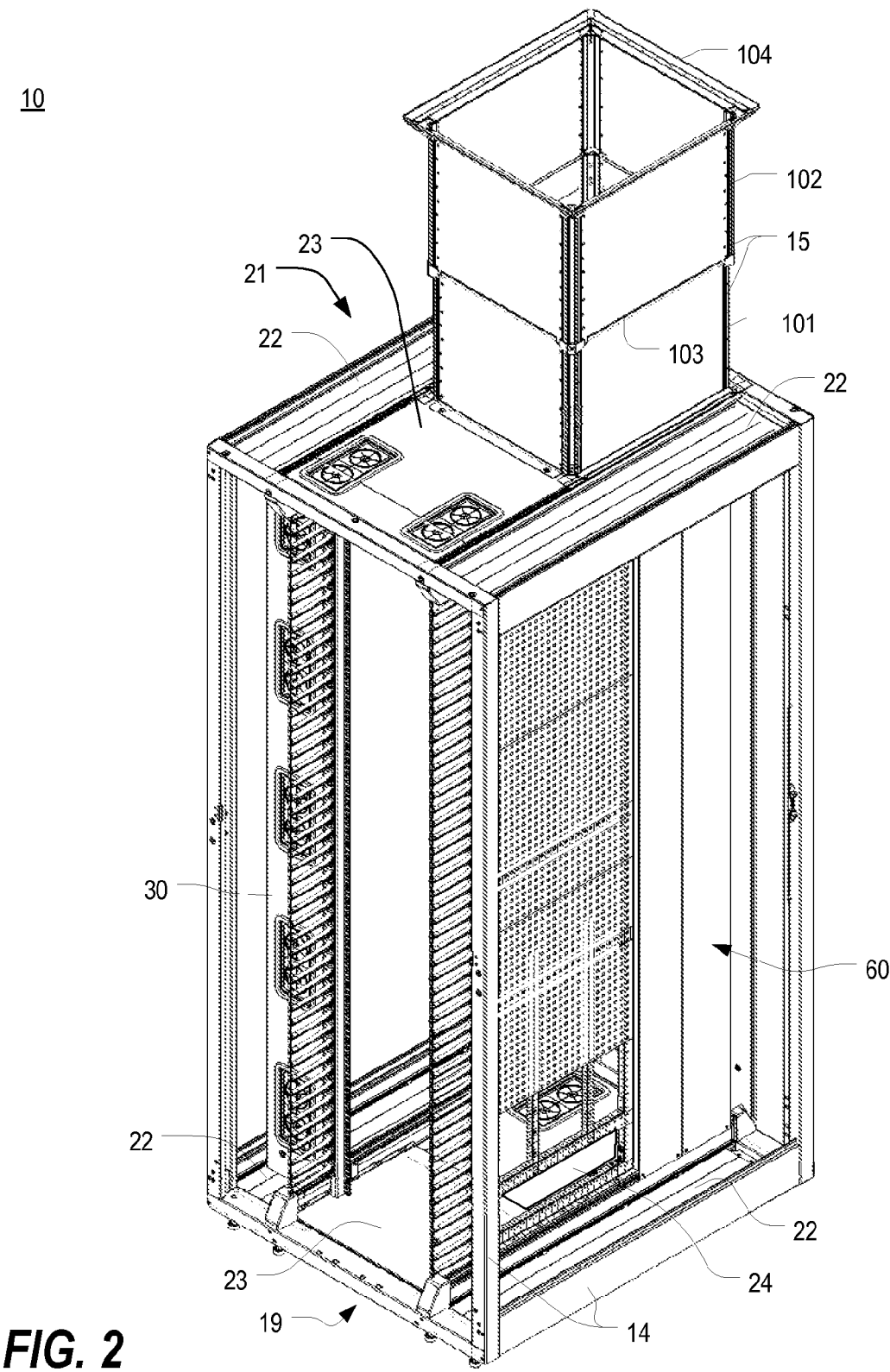
FIG. 2 is an isometric view of the electronic equipment enclosure system of FIG. 1, shown with the door panels and side panels removed.

FIG. 1 is an isometric view of an electronic equipment enclosure system 10 in accordance with one or more preferred embodiments of the present invention; and FIG. 2 is an isometric view of the electronic equipment enclosure system 10 of FIG. 1, shown with the door panels and side panels removed. As shown therein, the enclosure system 10 includes a four post frame structure 14 supporting a front panel assembly 16, a rear panel assembly 18, a pair of side panel assemblies 20, a top panel assembly 21, a bottom panel assembly 19, and a vertical exhaust duct assembly 15. In the illustrated embodiment, the front panel assembly 16 and the rear panel assembly 18 are each implemented as a pair of hinged doors; the side panel assemblies 20 are each implemented as upper and lower panels; the top panel assembly includes a center panel 23 and two front-to-back panels 22; and the bottom panel assembly 19 includes a front center panel 23, a rear center panel 24, and two front-to-back panels 22. However, it will be appreciated that various replacement components may be substituted for the components of the enclosure system, without departing from the scope of the present invention. For example, at least one alternative top panel assembly 21 is disclosed in commonly-assigned U.S. Pat. No. 7,957,139, issued Jun. 7, 2011 to Davis et al, the entirety of which is incorporated herein by reference.

The vertical exhaust duct assembly 15 exhausts heated air from a rear plenum in the rear of the enclosure. In at least some embodiments, the vertical exhaust duct assembly 15 includes two telescoping duct sections 101,102 and uses flexible seals 103,104 between the two telescoping duct sections and at the top of the upper duct section 102 to minimize leakage of heated exhaust air from the vertical exhaust duct assembly 15. Vertical exhaust duct assemblies are likewise disclosed in the aforementioned U.S. Pat. No. 7,957,139 and in commonly-assigned U.S. Pat. No. 7,804,685, issued Sep. 28, 2010 to William Krietzman, the entirety of which is incorporated herein by reference.

One or more side rail air dams 30 may also be provided to block or otherwise control air between a front or rear plenum of the enclosure and a side plenum. Side rail air dams, and seals for such air dams, are described in commonly-assigned U.S. patent application Ser. No. 13/229,706, filed Sep. 10, 2011 and published Mar. 15, 2012 as U.S. Patent Pub. No. 2012/0063099 A1 (the "'706 application"), the entirety of which is incorporated herein by reference.

Figure 3:
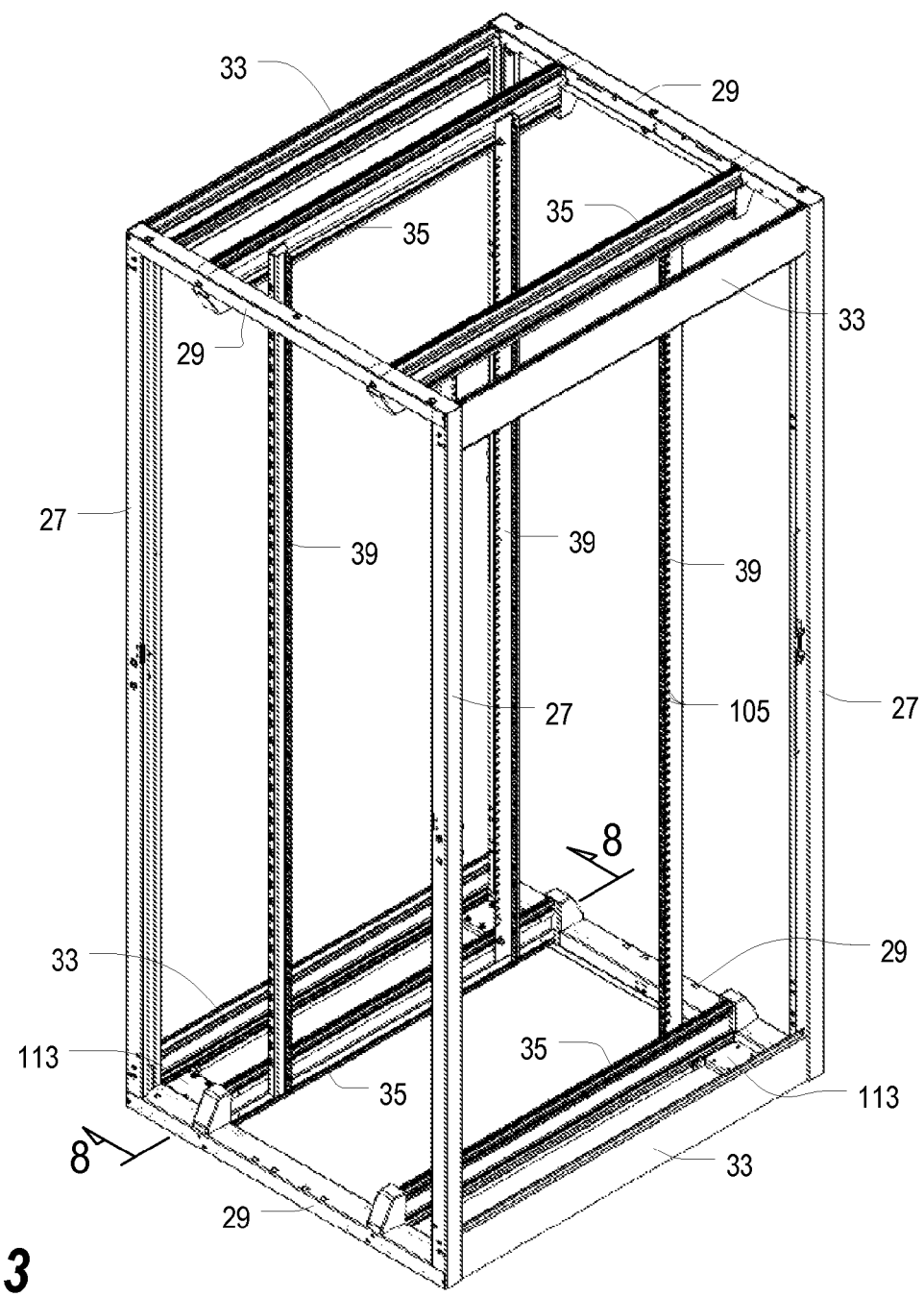
FIG. 3 is an isometric view of the frame structure and mounting rails of the electronic equipment enclosure system of FIG. 2.

FIG. 3 is an isometric view of the frame structure 14 and mounting rails 35,39 of the electronic equipment enclosure system 10 of FIG. 2. As shown therein, the frame structure 14 includes a front frame and a rear frame connected by upper and lower front-to-back members 33. The front frame and rear frame each include a pair of vertical members 27 and upper and lower cross members 29. In at least some embodiments, the front and rear frames are constructed from steel members, and the front-to-back members 33 are constructed of extruded aluminum.

In the illustrated embodiment, the mounting rails include four horizontal mounting rails 35 connected between the front and rear frames and a plurality of vertical mounting rails 39 supported by the horizontal mounting rails 35. As shown, the horizontal mounting rails 35 are constructed of extruded aluminum and include lengthwise slots adapted to retain fastener heads, nuts for receiving fasteners, or the like, wherein the fasteners are used to connect the vertical mounting rails 39 to the horizontal mounting rails 35. Each vertical mounting rail 39 is constructed of a length of steel or aluminum that includes a series of evenly-spaced mounting apertures 105, which may or may not be threaded, extending along substantially its entire length, for use in mounting electronic components, peripheral devices, cable brackets, additional mounting members, or the like thereto. However, in at least some embodiments, each horizontal mounting rail 35 may be a length of steel or aluminum that includes a series of evenly-spaced, threaded mounting apertures, extending along substantially its entire length, and in at least some embodiments, each vertical mounting rail 39 may be an extrusion that includes one or more lengthwise slots. In some embodiments, one or more series of apertures may be a series of threaded apertures.

In some embodiments of an electronic equipment enclosure system 10 having a side-to-side airflow control system, the frame structure 14 may make use of offset brackets to support front panels, rear panels, side panels, top panels, and/or bottom panels. Offset brackets are disclosed in the aforementioned U.S. Pat. No. 7,957,139 and in commonly-assigned U.S. patent application Ser. No. 11/837,537, filed Aug. 12, 2007 and published Feb. 14, 2008 as U.S. Patent Pub. No. US 2008/0035810 A1 (the "'537 application"), the entirety of which is incorporated herein by reference.

Figure 4:
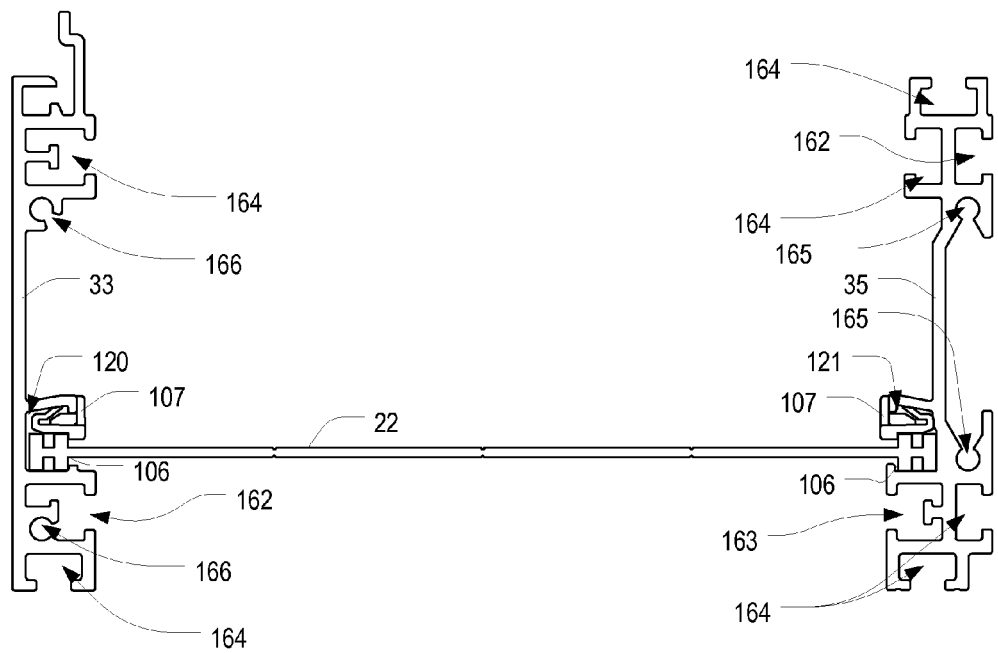
FIG. 4 is an end view of one of the front-to-back panels of FIGS. 1 and 2 installed between a horizontal mounting rail and a front-to-back frame member.
Figure 5:
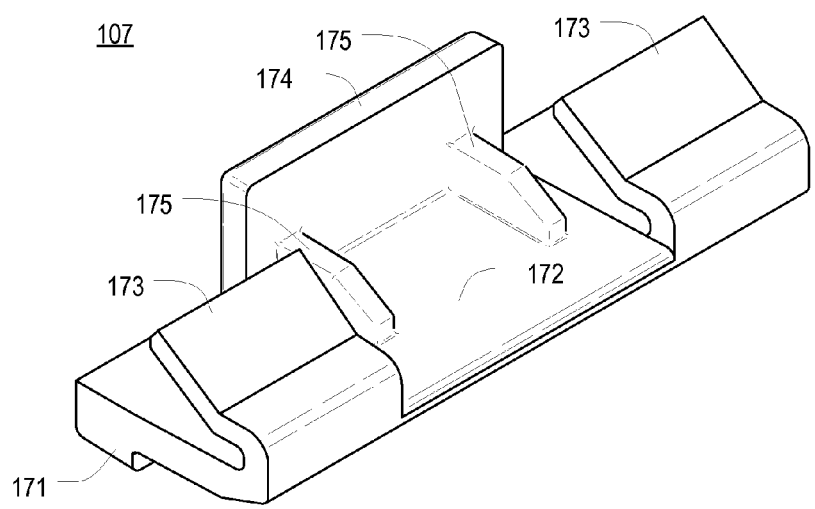
FIG. 5 is an isometric view of a clip of FIG. 4.
Figure 6:
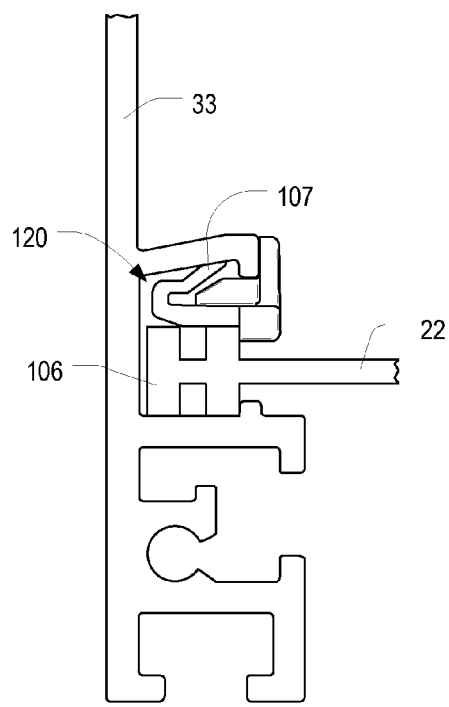
FIG. 6 is an enlarged fragmentary view of a portion of the front-to-back panel and clip installed in a slot in the front-to-back frame member of FIG. 4.

The panels of the top and bottom panel assemblies 21,19 may be implemented in a variety of ways, some of which may be conventional and some of which may be novel. In this regard, FIG. 4 is an end view of one of the front-to-back panels 22 of FIGS. 1 and 2 installed between a horizontal mounting rail 35 and a front-to-back frame member 33. As shown therein, the construction of the front-to-back panels 22 includes a reinforced portion 106 along its edge. In at least some embodiments, the reinforced portions 106 are T-shaped. Each of the horizontal mounting rail 35 and the front-to-back frame member 33, which are both of extruded construction, includes, as one of its longitudinal slots, a respective slot 120,121 for receiving one of those reinforced edges 106. In at least some embodiments, the slots 120,121 have contours that retain the panels 22 therein. In at least some of these embodiments, the slots 120,121 are T-shaped, while in others, the slots may be L-shaped. One or more clips 107 may be pressed into the slot 120,121 next to the edge of the panel 22, thereby pinning it there. An isometric view of such a clip 107 is shown in FIG. 5. Edges and contours of the clip 107 interact with corresponding edges and contours in the slot 120,121. In this regard, FIG. 6 is an enlarged fragmentary view of a portion of the front-to-back panel 22 and clip 107 installed in a slot 120 in the front-to-back frame member 33 of FIG. 4. In particular, the clip 107 includes a first portion 171 that hooks over an edge of the reinforced portion 106 of the panel 22, a second portion 172 that is disposed against the side of the reinforced portion 106, and one or more resilient third portion 173 that may be temporarily deflected to seat the clip 107 within a slot 120,121. Fourth and fifth portions 174,175 may also be included to provide a more stable fit by abutting various surfaces on the outside or inside of the slot 120,121.

Figure 7:
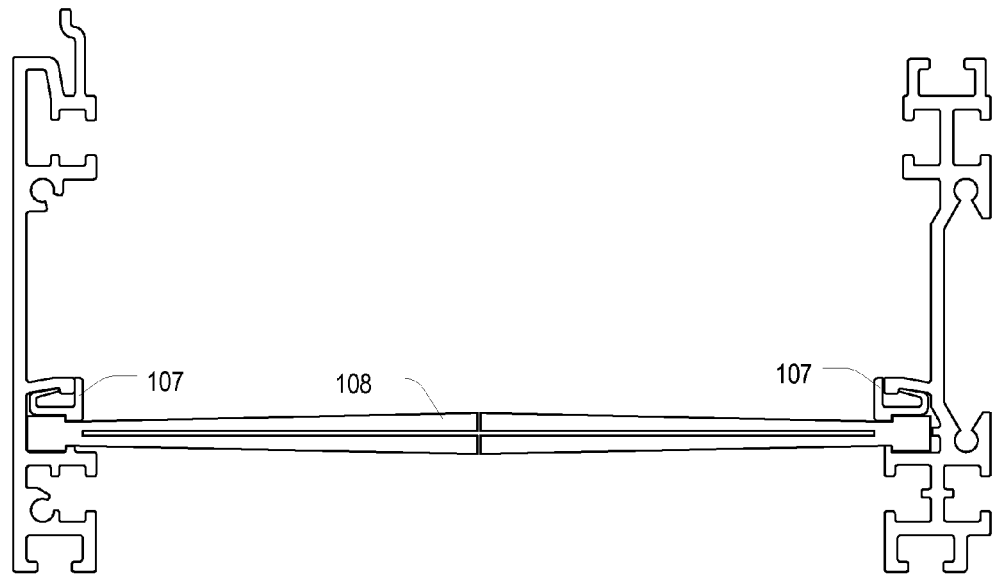
FIG. 7 is an end view of a split brush assembly installed between a horizontal mounting rail and a front-to-back frame member.

The illustrated panels 22 are simple solid panels with reinforced edges. It will be appreciated that other partition structures may likewise be installed between horizontal mounting rail 35 and a front-to-back frame member 33. For example, FIG. 7 is an end view of a split brush assembly 108 installed between a horizontal mounting rail 35 and a front-to-back frame member 33. Other partition structures may include panels with louvers, panels with slide openings, perforated panels, or the like. Other slots in the horizontal mounting rail 35 and front-to-back frame member 33 of FIGS. 4 and 7 include slots 162 for receiving and supporting the top or bottom center panels 23, slots 162,163 for receiving the caster assembly 113 (described elsewhere herein), and various slots 164 for receiving air dam panels and other accessories.

Figure 8:
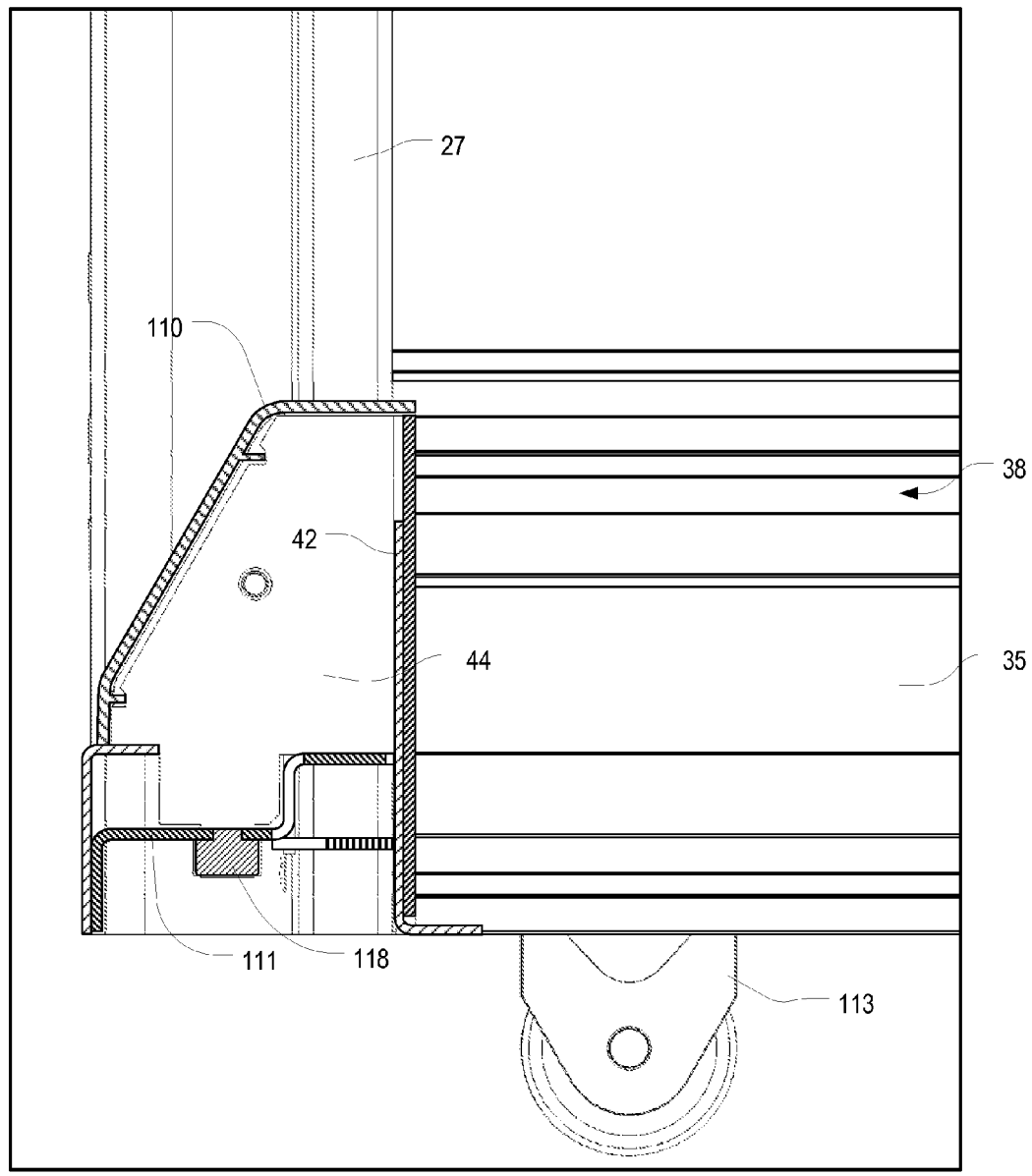
FIG. 8 is a fragmentary side cross-sectional view of a front lower left corner of the frame structure and mounting rails of the electronic equipment enclosure system of FIG. 3, taken along line 8-8.
Figure 9:
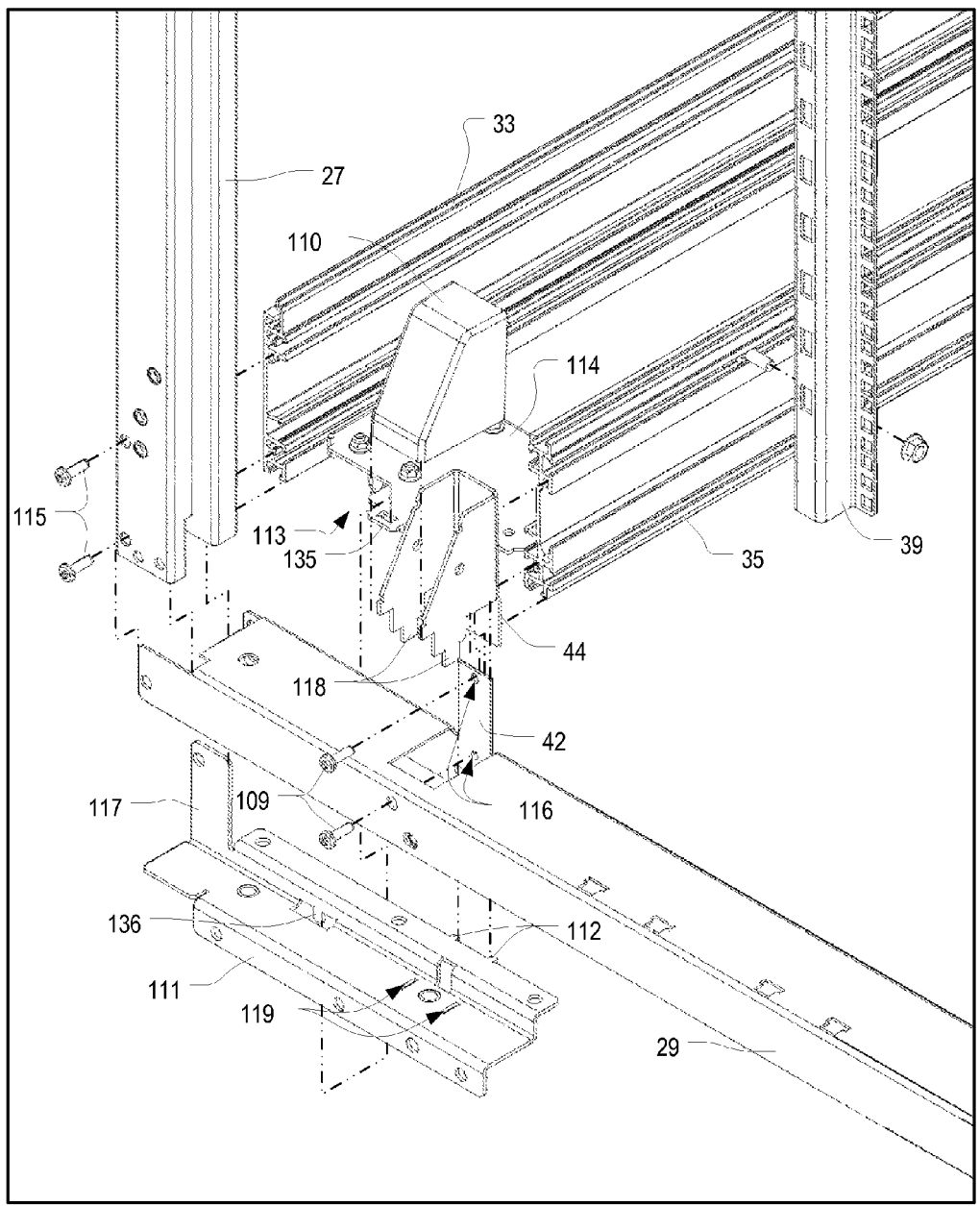
FIG. 9 is a fragmentary exploded isometric view of the front lower left corner of the frame structure and mounting rails of the electronic equipment enclosure system of FIG. 3.

In accordance with one or more aspects of the present invention, a novel structure may be utilized for connecting the horizontal mounting rails 35 to the front and rear frames. In this regard, FIG. 8 is a fragmentary side cross-sectional view of a front lower left corner of the frame structure 14 and mounting rails 35,39 of the electronic equipment enclosure system 10 of FIG. 3, taken along line 8-8; and FIG. 9 is a fragmentary exploded isometric view of the front lower left corner of the frame structure 14 and mounting rails 35,39 of the electronic equipment enclosure system 10 of FIG. 3. As shown therein, the vertical mounting rails 39 are connected by a fastener to one or more of the longitudinal slots 162 in the horizontal mounting rails 35, and the horizontal mounting rails 35 are connected to the frame cross members 29. To facilitate this, the cross member 29, which has a generally C-shaped cross-section, includes an upright tab 42 which extends upward into a brace structure 44, and fasteners 109 extend through apertures 116 in the upright tab 42, corresponding apertures (not shown) in the brace structure 44, and into cylindrical receptacles 165 (shown in FIG. 4) in the end of the extruded horizontal mounting rail 35. A cover 110 fits over the brace structure 44 and upright tab 42.

In addition, a corner reinforcement plate 111 is disposed below and generally within each end of the cross member 29. The corner reinforcement plate 111 includes positioning tabs 112, against and between which the upright tab 42 extends, as well as an upright gusset 117, located at the end of the plate 111, which is connected to the vertical frame member 27 at that corner via fasteners 115 that extend through apertures and into cylindrical receptacles 166 (shown in FIG. 4) in the end of the front-to-back frame member 33 there. The corner reinforcement plate 111 also includes a pair of slots 119 for receiving tabs 118 located on the bottom of the brace structure 44.

A caster assembly 113 may be located at each corner and includes a caster plate 114 that is connected between the front-to-back frame member 33 and the horizontal mounting rail 35. The caster plate 114 also includes a slot tab 135 that receives a corresponding lock tab 136 extending downward from the corner reinforcement plate 111.

Figure 10:
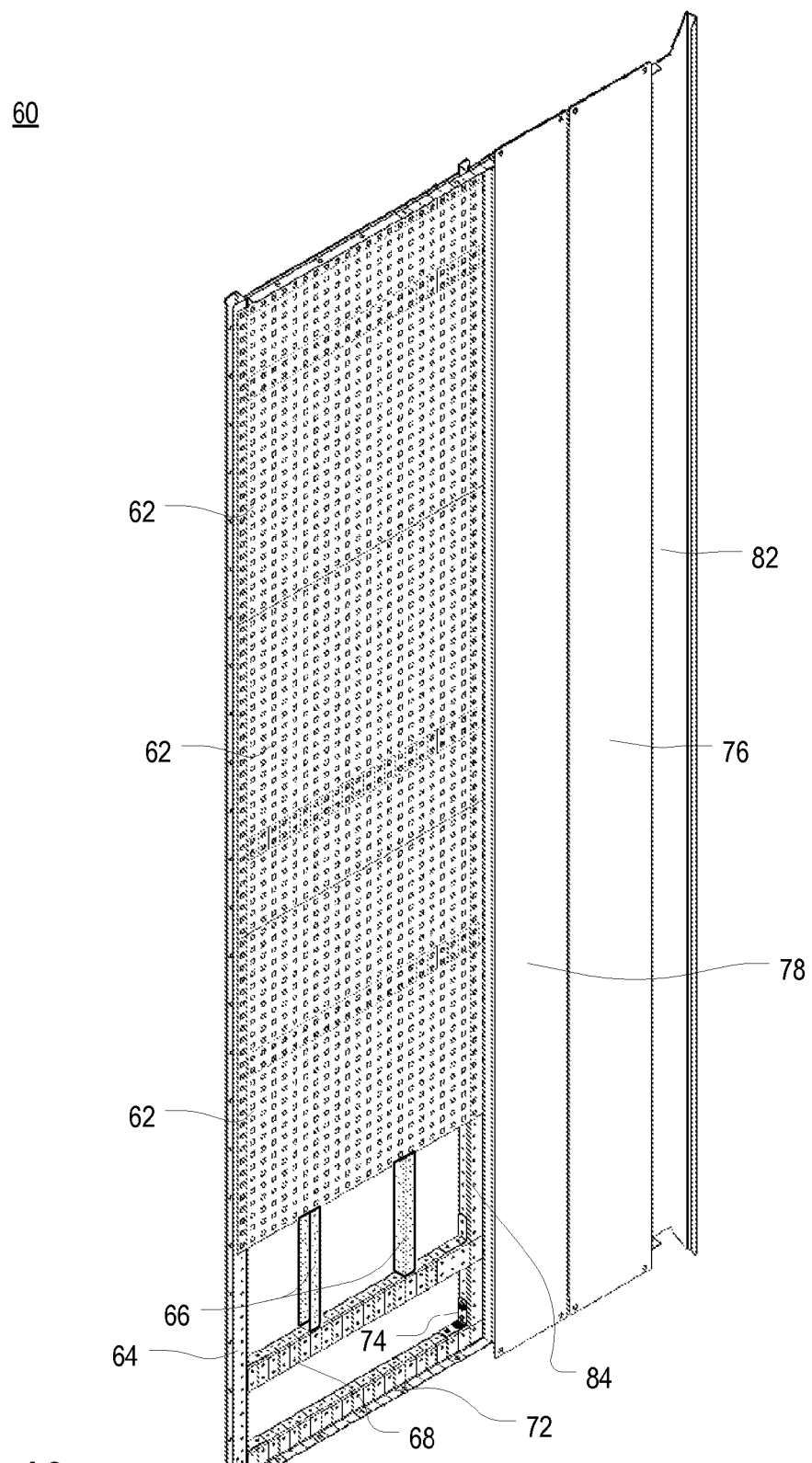
FIG. 10 is an isometric view of the side air dam kit as implemented in FIG. 2.
Figure 11:
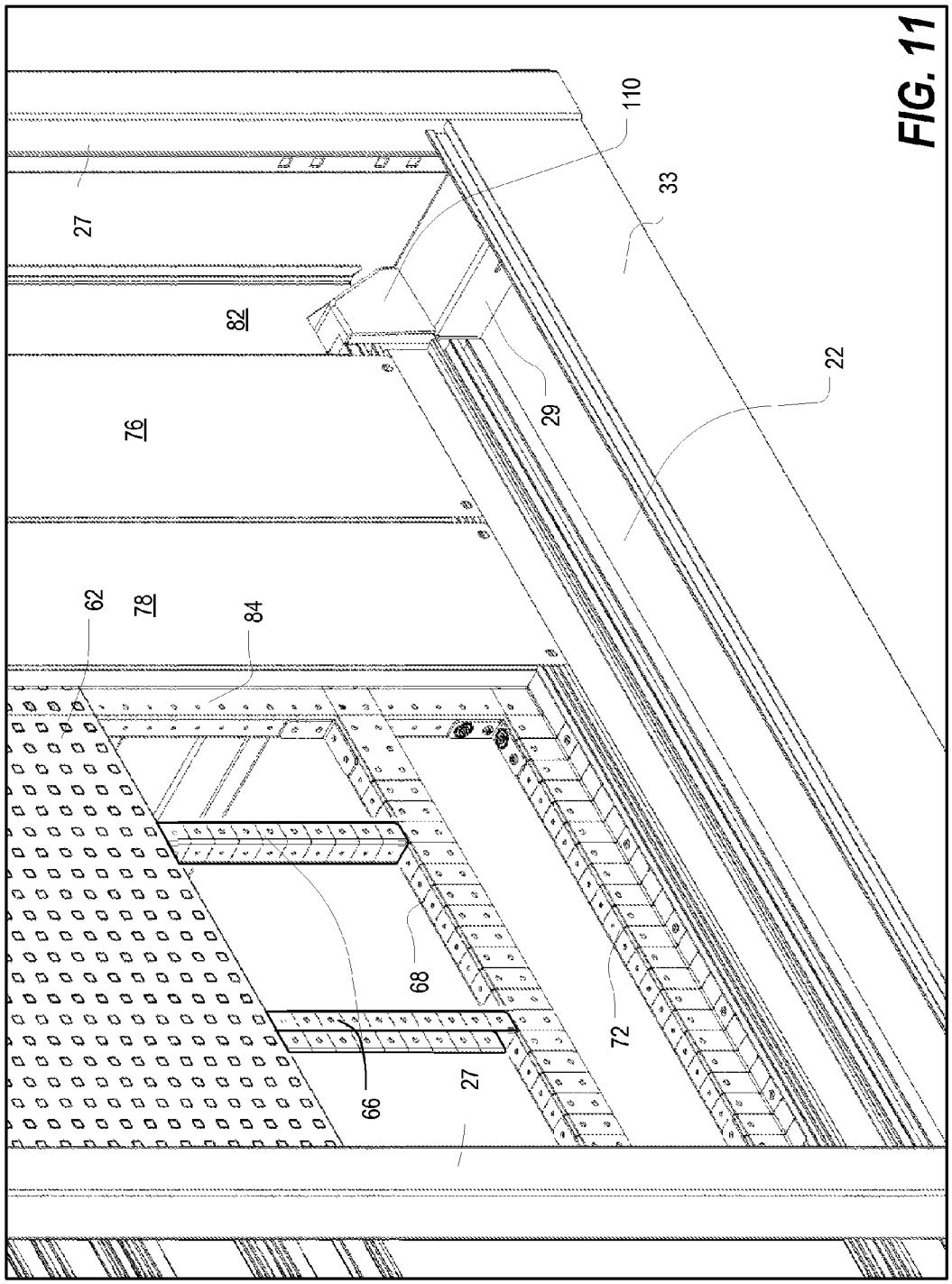
FIG. 11 is an enlarged fragmentary isometric view of a lower portion of the electronic equipment enclosure system of FIG. 2.
Figure 12:
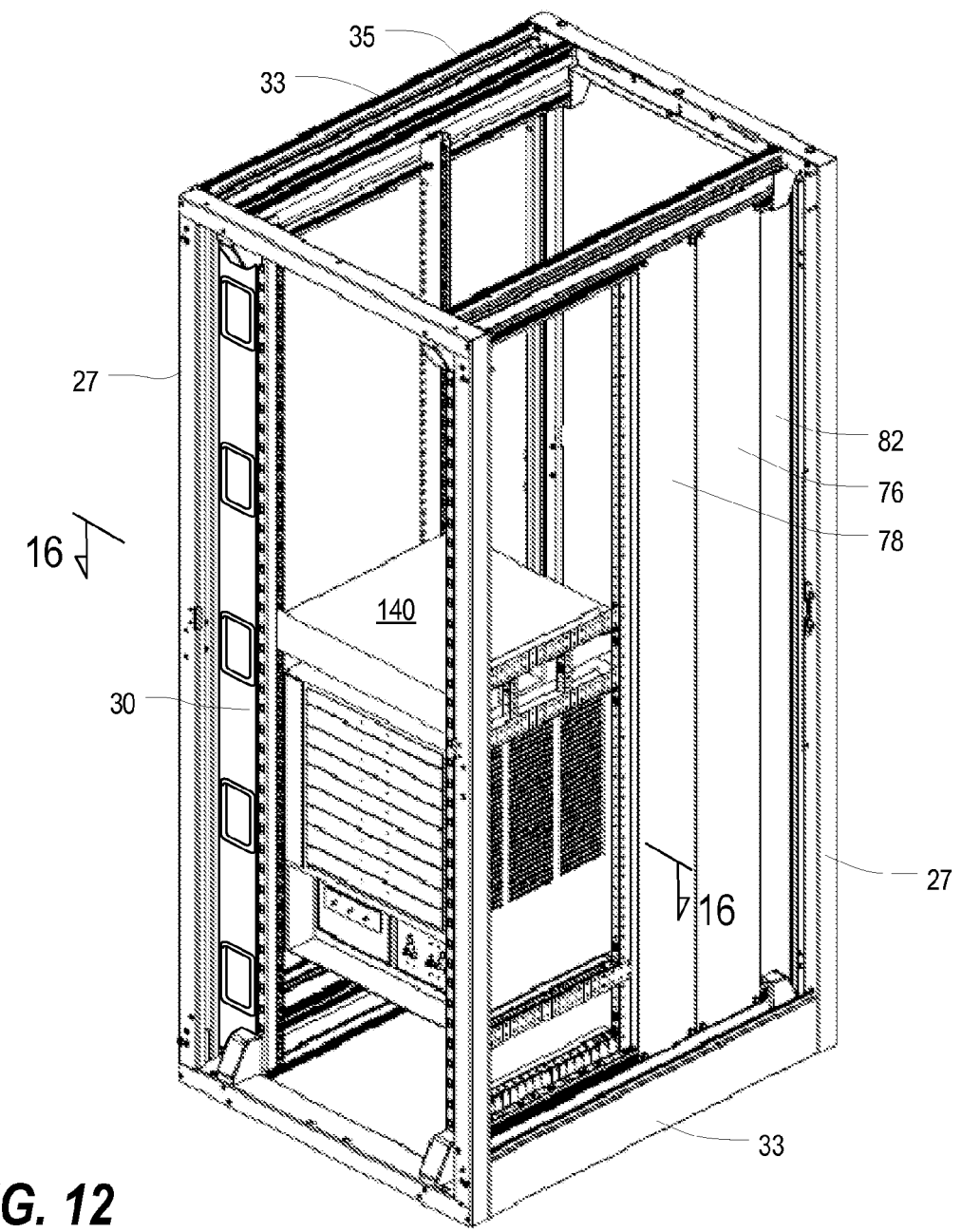
FIG. 12 is a front orthogonal view of a frame structure and mounting rails similar to that of FIG. 3, but shown with side-breathing electronic equipment and portions of the side air dam kit installed therein.
Figure 13:
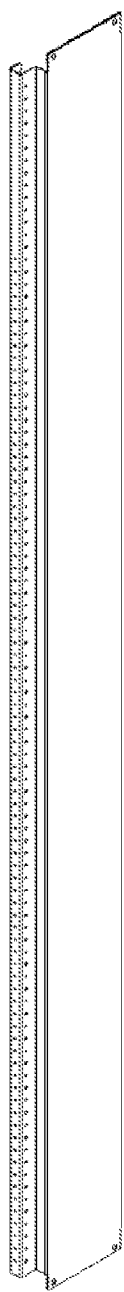
FIG. 13 is an isometric view of the adjustable rear panel of the rear air dam of FIG. 10.
Figure 14:
FIG. 14 is an isometric view of the rear filler panel of the rear air dam of FIG. 10.
Figure 15:
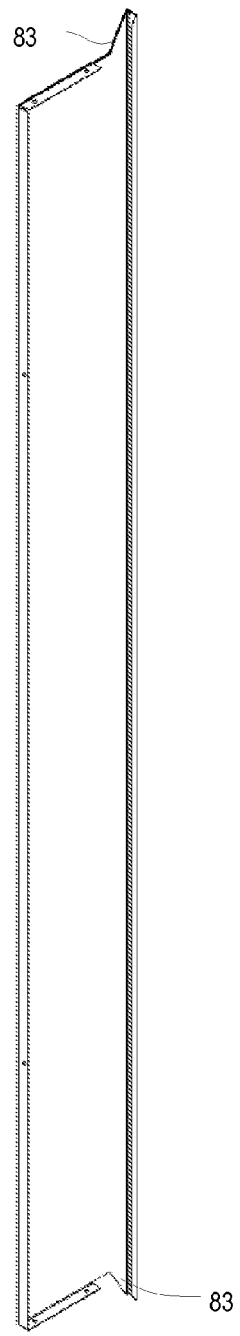
FIG. 15 is an isometric view of the fixed rear panel of the rear air dam of FIG. 10.

FIG. 10 is an isometric view of the side air dam kit 60 as implemented in FIG. 2. As shown therein, the side air dam kit 60 includes customizable air dam panels 62, one or more rear panels 76,78,82, and horizontal and vertical frame pieces 64,66,68,72. The rear panels 76,78,82 are used to create an air dam to the rear of equipment 140 installed in the enclosure 10. In this regard, FIG. 11 is an enlarged fragmentary isometric view of a lower portion of the electronic equipment enclosure system 10 of FIG. 2, and FIG. 12 is a front orthogonal view of a frame structure 14 and mounting rails similar to that of FIG. 3, but shown with side-breathing electronic equipment 140 and portions of the side air dam kit 60 installed therein. The rear panels 76,78,82 may be designed and installed in a fixed location or their position may be adjustable. In at least some embodiments, including the illustrated embodiments, the rear panels include a fixed rear panel 82, an adjustable rear panel 78, and a rear filler panel 76. In this regard, FIG. 13 is an isometric view of the adjustable rear panel 78 of the rear air dam of FIG. 10; FIG. 14 is an isometric view of the rear filler panel 76 of the rear air dam of FIG. 10; and FIG. 15 is an isometric view of the fixed rear panel 82 of the rear air dam of FIG. 10. Each of the rear panels 76,78,82 is sized so as to extend substantially the entire height of the interior of the enclosure 10. Different heights may be provided for use in enclosures of different heights, and different depths (front to back) may be provided for enclosures having different depths.

Figure 16:
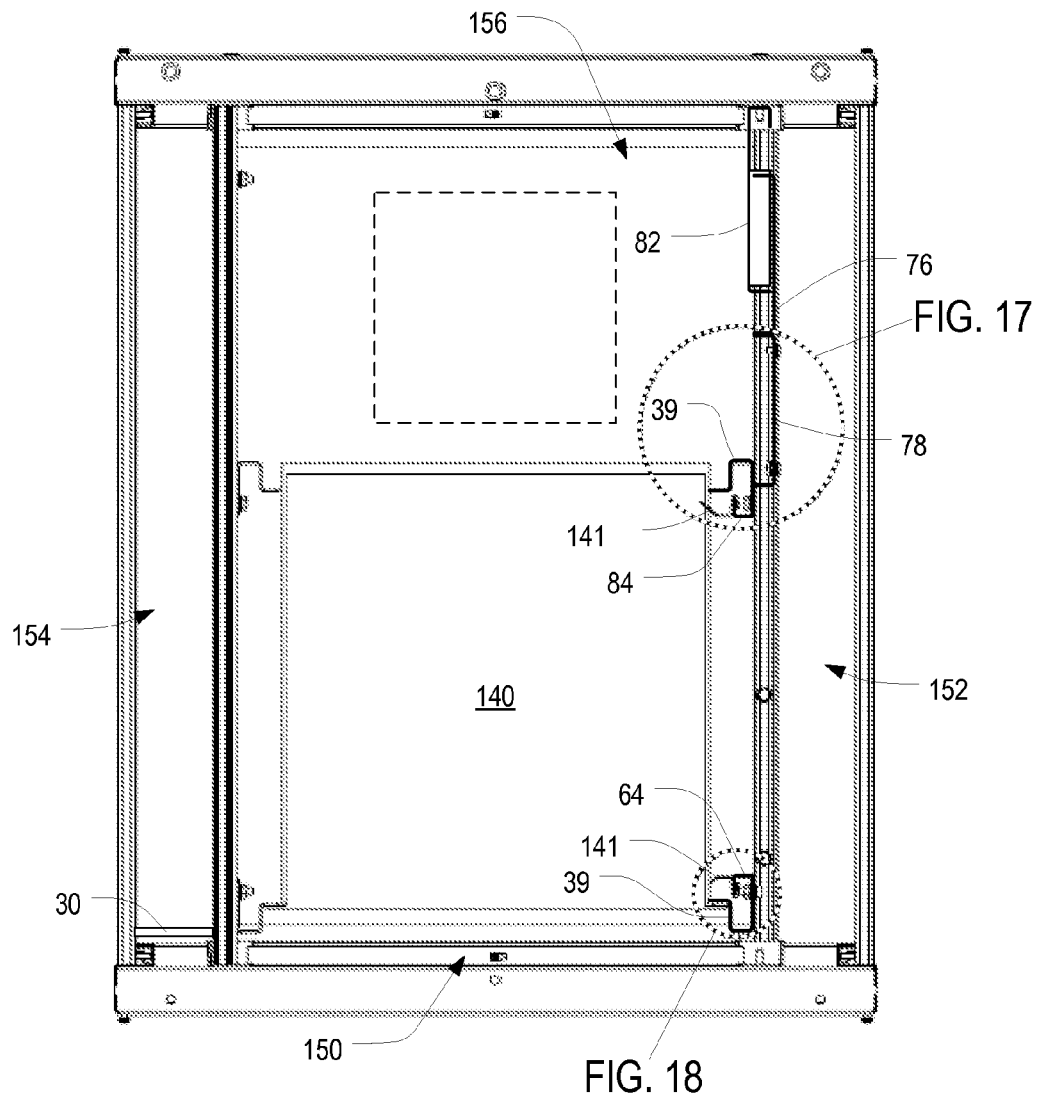
FIG. 16 is a top cross-sectional view of the frame structure, mounting rails, side-breathing electronic equipment, and side air dam kit of FIG. 12.
Figure 17:
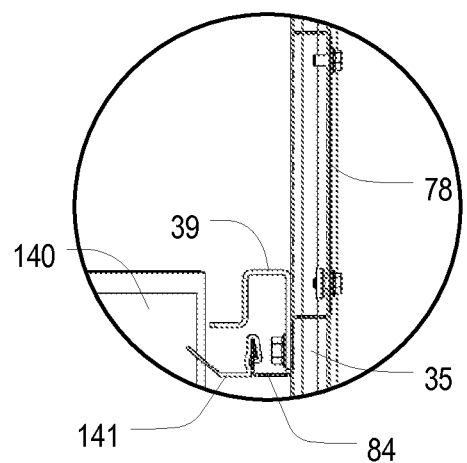
FIGS. 17 and 18 are enlarged fragmentary portions of FIG. 16.
Figure 18:
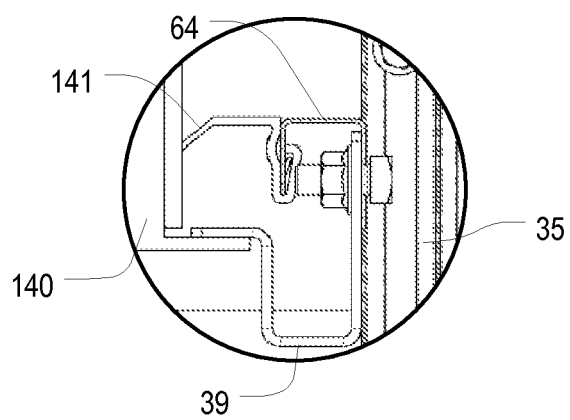

FIG. 16 is a top cross-sectional view of the frame structure 14, mounting rails 35,39, side-breathing electronic equipment 140, and side air dam kit 60 of FIG. 12. As shown in FIGS. 3, 11, 12, and 16, the electronic equipment 140 is supported by four vertical mounting rails 39 which in turn are supported by the horizontal mounting rails 35. In at least some embodiments, the adjustable rear panel 78 is connected to, or at least abuts against, the rearmost vertical mounting rail 39, and a vertical frame piece 64 is connected to, or at least abuts against, the frontmost vertical mounting rail 39. These are shown in FIGS. 17 and 18, which are enlarged fragmentary portions of FIG. 16. Furthermore, a respective intake extrusion seal 141 may be mounted along an edge of each of the front vertical frame piece 64 and the vertical frame piece 84 of the adjustable rear panel 78.

The fixed rear panel 82 may be installed at the rear of the enclosure 10. In at least some embodiments, the fixed rear panel 82 includes geometry that matches the geometry of the rear panel assembly 18 and any other structures that may be located there so as to close any significant air gaps that may otherwise exist. For example, the illustrated fixed rear panel 82 includes upper and lower angled portions 83 that fit under or over, respectively, the brace structures 44, including their covers 110, that connect the horizontal mounting rails 35 to the frame structure 14. The adjustable rear panel 78 is positioned at least partially forward of the fixed rear panel 82 so as to extend from the rear of electronic equipment installed in the enclosure 10. In some embodiments, the adjustable rear panel 78 extends from the rear of the electronic equipment and overlaps the fixed rear panel 82, while in other embodiments, the filler panel 76 is installed so as to abut the rear of the adjustable rear panel 78, and the filler panel 76 overlaps the fixed rear panel 82. In other words, in at least some embodiments, the filler panel 76 is only utilized when the adjustable panel 78 and fixed panel 82 do not overlap each other.

Figure 19:
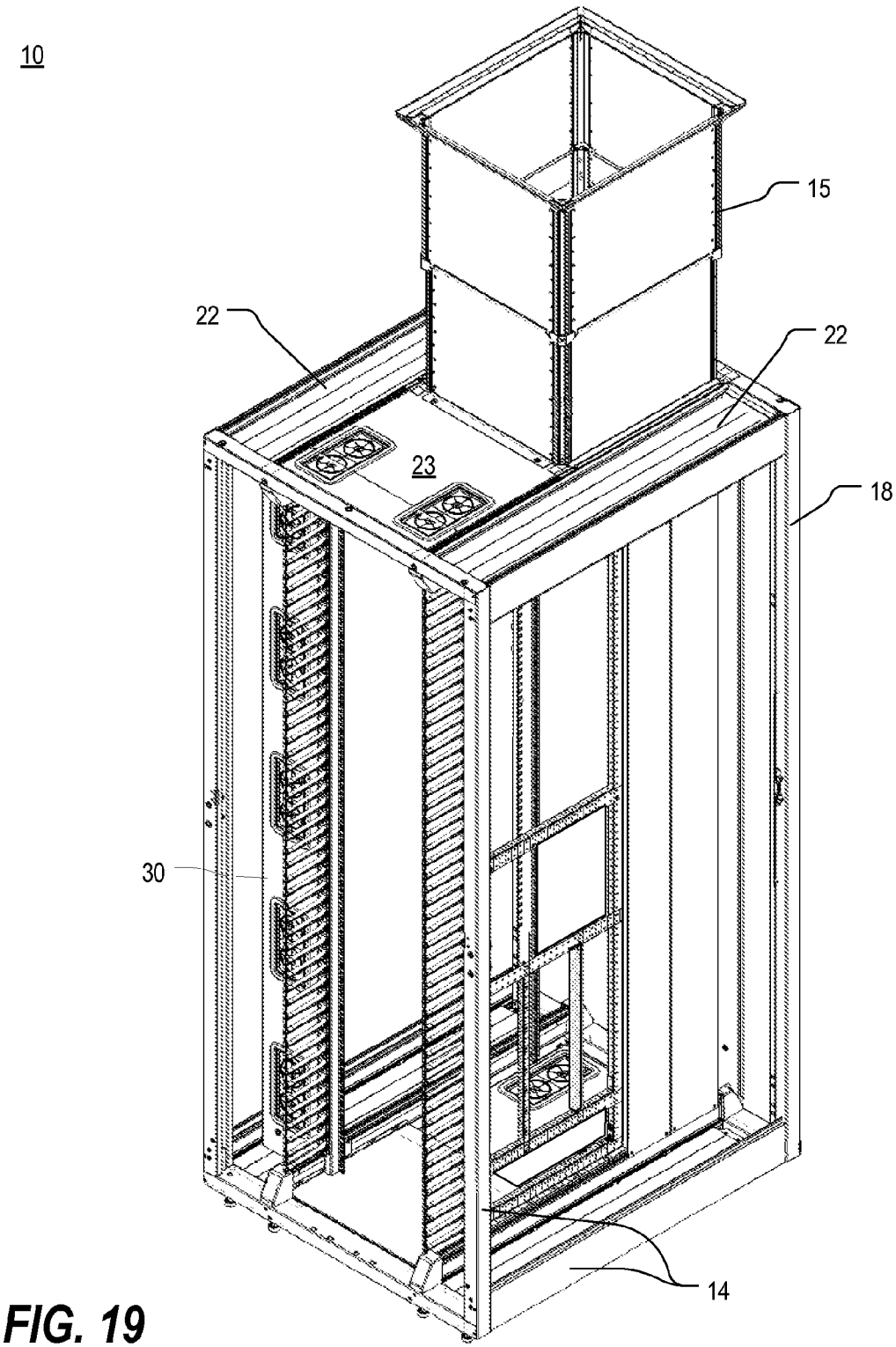
FIG. 19 is an isometric view of the electronic equipment enclosure system of FIG. 2, shown with the customizable air dam panels removed so as to illustrate the air dam framework built using horizontal and vertical air dam frame pieces.

The various frame pieces 64,66,68,72,84 are used to build a framework that can be selectively covered with a customizable air dam layer using portions or entire sheets of the customizable air dam panels 62. In this regard, FIG. 19 is an isometric view of the electronic equipment enclosure system 10 of FIG. 2, shown with the customizable air dam panels 62 removed so as to illustrate the air dam framework built using horizontal and vertical air dam frame pieces 64,66,68,72,84 while an alternative framework can be seen in FIG. 12. In at least some embodiments, the framework is customized by an installer to include rectangular framed openings around the air intake openings of the electronic equipment that is installed, or is to be installed, in the enclosure, and additional frame pieces are added as necessary to support those framed openings and to support larger pieces of air dam panels 62. Horizontal frame pieces 68,72 may have different geometries, and in at least some embodiments, horizontal frame pieces of different geometries are used. In this regard, FIG. 20 is an isometric view of a horizontal air dam frame piece 68 of a type used in the side air dam kit 60 of FIG. 10, and FIG. 21 is an isometric view of another horizontal air dam frame piece 72 of a type used in the side air dam kit 60 of FIG. 10. The horizontal frame piece 72 of FIG. 21 may be preferred for installation at the top or bottom of the large opening to the left of the rear panels 76,78,82 in FIG. 19 because they can be attached directly to the front-to-back members 33, while the horizontal frame piece 68 of FIG. 8 may be preferred for installation at intermediate heights between the top and bottom of the large opening. Likewise, vertical frame pieces 64,66,84 may have different geometries, and in at least some embodiments, vertical frame pieces of different geometries are used. In this regard, FIG. 22 is an isometric view of a vertical air dam frame piece 66 of a type used in the side air dam kit 60 of FIG. 10. Furthermore, in at least some embodiments, including illustrated embodiments, the adjustable rear panel 78 includes an integrated frame piece 84.

At least some of the frame pieces, such as the frame pieces 66,68,72 of FIGS. 20-22, are laser cut or otherwise manufactured to enable them to be easily cut, snapped, or otherwise broken so as to shorten their overall length. In at least some embodiments, the cuts are at uniform incremental spacings, such as at 25 mm for horizontal frame pieces and 1 RMU for vertical frame pieces. A process of cutting a frame piece is illustrated in FIGS. 23A-23D, wherein the frame piece 66 is held and a cutting tool 99 used to break first one side and then the other of an incremental portion of the frame piece 66, and then the corresponding center portion is broken and the incremental portion of the frame piece 66 is removed. Thus, by supplying a quantity of standardized lengths of horizontal and vertical frame pieces, an installer is enabled to create customized frameworks by cutting the frame pieces to their desired lengths. For example, in FIG. 19, a plurality of horizontal frame pieces 68 of the original length shown in FIG. 20 have been shortened to span the distance between the vertical frame piece on the left of the large opening and the integrated vertical frame piece 84 on the right of the opening. Similarly, a vertical frame piece 66 of the original length shown in FIG. 22 has been separated and shortened and installed between two of the horizontal frame pieces 68 in that opening so as to frame a still smaller rectangle. An alternative arrangement of vertical and horizontal and vertical frame pieces 68,66 have been installed in the large opening to the left of the rear panels 76,78,82 in FIG. 12.

Figure 24:
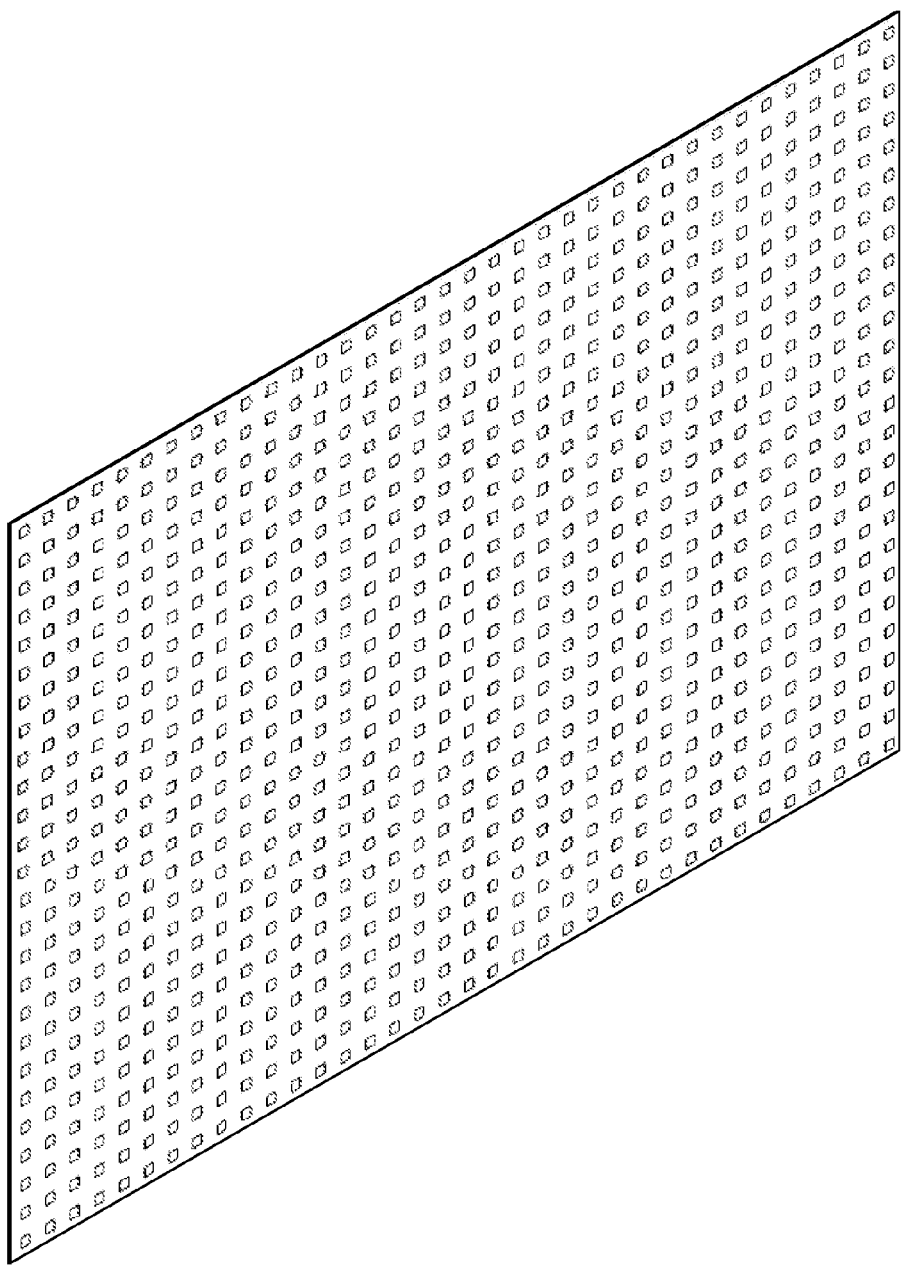
FIG. 24 is an isometric view of one of the customizable air dam panels of FIG. 10.

With the framework constructed, one or more customizable air dam panels 62 are used to cover all of the framework except the desired openings. FIG. 24 is an isometric view of one of the customizable air dam panels 62 of FIG. 10, while FIG. 2 illustrates the placement of a plurality of air dam panels like that of FIG. 10 on the framework of FIG. 19. Individual air dam panels 62 may be used in their entirety, or may be separated into customized portions, as desired. In some embodiments, the panels 62 may be scored into incremental sections. In at least some of these embodiments, the spacings are similar to those used for the horizontal and vertical frame pieces. Overall, each air dam panel 62 may be cut to length and height, and may be fastened to frame pieces of the framework via apertures penetrating therethrough. In some embodiments, pre-cut apertures may be provided so as to be punched out at desired locations; such openings may likewise be provided at uniform spacings.

Figure 25:
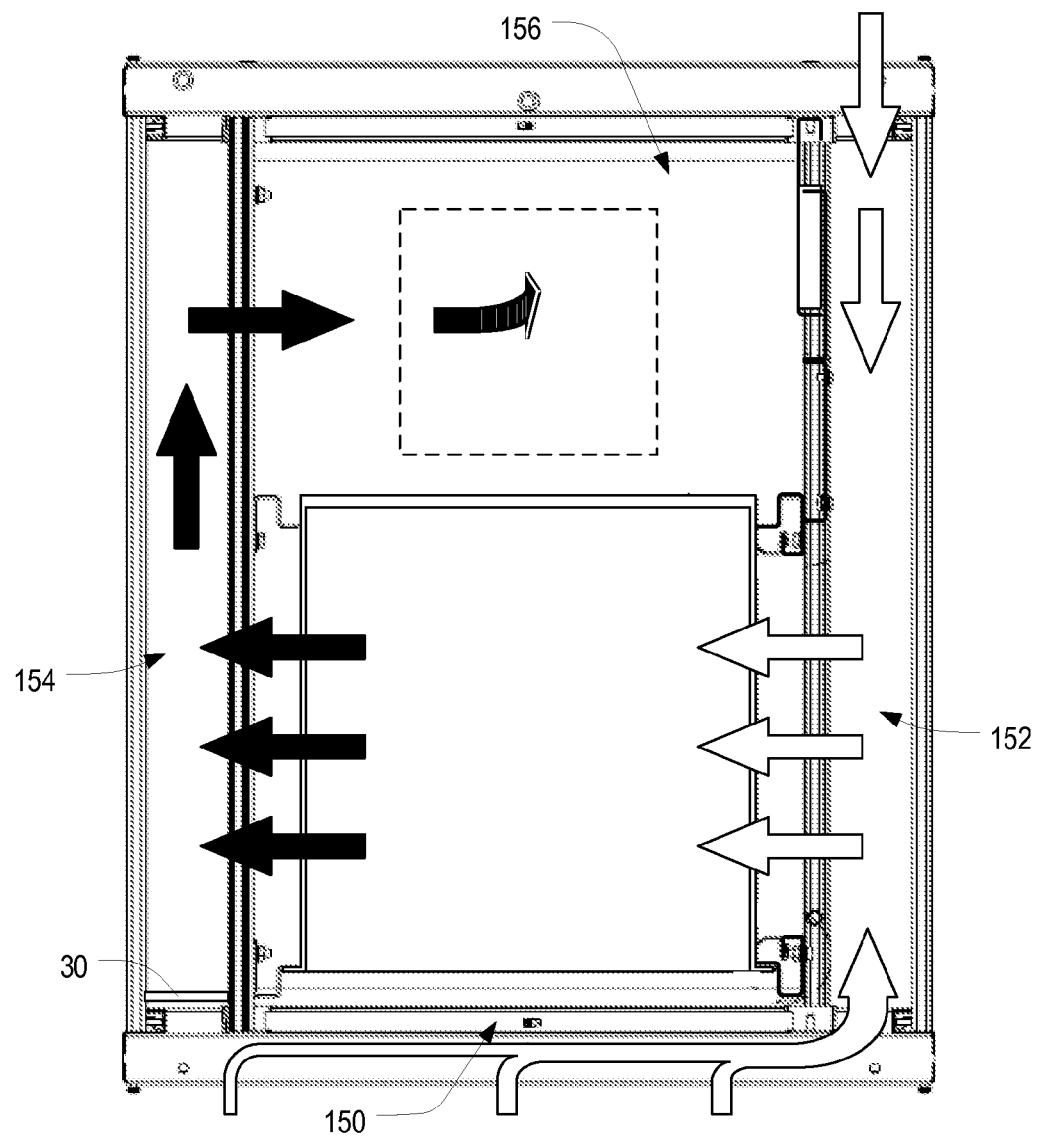
FIG. 25 is a top cross-sectional view similar to that of FIG. 16, showing the flow of air therethrough.

The side air dam kit 60 is used to segregate cool supply air and heated exhaust air within an enclosure 10. For example, FIG. 25 is a top cross-sectional view similar to that of FIG. 16, showing the flow of air therethrough. In the illustrated embodiment illustrated in FIGS. 12 and 25, cool supply air enters a front plenum 150 of the enclosure through perforations in the front panel assembly 16 and also enters a side plenum 152 of the enclosure 10 through perforations along one side or edge of the rear panel assembly 18. However, it will be appreciated that cool supply air could alternatively enter only through the front or the rear but not both. In the front plenum 150 of the enclosure, air is blocked from flowing along the left side of the equipment by the side rail air dam 30, while panels (not shown) above and below the equipment block air from passing over or under the equipment. The air from the front plenum 150 thus flows into the right side plenum 152 where it joins the air entering from the rear. Customized air dam panels 62 (not shown in FIG. 12) prevent cool supply air from flowing over or under the equipment from the right side plenum. The cool supply air passes through the equipment and gathers in a plenum 154 on the left side of the enclosure before flowing to a rear plenum 156 and then upward through a vertical exhaust duct assembly 15 such as that of FIGS. 1 and 2.

Based on the foregoing information, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof.

What is claimed is:

1. An electronic equipment enclosure structure, comprising:
   (a) a frame structure, including:
      (i) a front frame, including a first pair of vertical frame members, a first upper side-to-side cross member, and a first lower side-to-side cross member,
      (ii) a rear frame, including a second pair of vertical frame members, a second upper side-to-side cross member, and a second lower side-to-side cross member,
      (iii) first and second front-to-back horizontal frame members connecting upper corners of the front frame to respective upper corners of the rear frame, and
      (iv) third and fourth front-to-back horizontal frame members connecting lower corners of the front frame to respective lower corners of the rear frame;
   (b) a plurality of front-to-back horizontal mounting rails, each made of extruded metal and having proximal and distal ends, including:
      (i) first and second horizontal mounting rails interconnected at their proximal ends to the upper side-to-side cross member of the front frame and at their distal ends to the upper side-to-side cross member of the rear frame such that the first and second horizontal mounting rails are disposed adjacent to, but spaced inwardly from, the first and second front-to-back horizontal frame members, and (ii) third and fourth horizontal mounting rails interconnected at their proximal ends to the lower side-to-side cross member of the front frame and at their distal ends to the lower side-to-side cross member of the rear frame such that the third and fourth horizontal mounting rails are disposed adjacent to, but spaced inwardly from, the third and fourth front-to-back horizontal frame members; and (c) a plurality of reinforced bracket assemblies, wherein each reinforced bracket assembly:

(i) is manufactured separately from the horizontal mounting rails and side-to-side cross members, and (ii) is subsequently attached to either a proximal or distal end of a horizontal mounting rail, and to either a front side-to-side cross member or a rear side-to-side cross member, such that the bracket assembly reinforces the interconnection of the respective horizontal mounting rail and the respective side-to-side cross member.

2. The electronic equipment enclosure structure of claim 1, wherein each side-to-side cross member includes opposed ends and first and second integral tabs, the tabs extending vertically from the cross member at locations that are spaced inwardly from the opposed ends thereof, and wherein each integral tab is interconnected to an end of a respective horizontal mounting rail.

3. The electronic equipment enclosure structure of claim 2, wherein each reinforced bracket assembly includes a brace structure, having at least an L-shaped cross-section that includes a first vertical portion that is interconnected to the end of the respective horizontal mounting rail and a second vertical portion, right-angled relative to the first vertical portion, that braces the first vertical portion against the respective side-to-side cross member.

4. The electronic equipment enclosure structure of claim 3, wherein the first vertical portion of each brace structure is disposed between the respective tab and the end of the respective horizontal mounting rail.

5. The electronic equipment enclosure structure of claim 4, wherein the first vertical portion of each brace structure and the respective tab are fastened to the end of the respective horizontal mounting rail via a respective fastener connected to a slot that is part of the extrusion of the horizontal mounting rail.

6. The electronic equipment enclosure structure of claim 5, wherein the slot is a cylindrical slot and the fastener is threaded into the cylindrical slot.

7. The electronic equipment enclosure structure of claim 3, wherein each reinforced bracket assembly further includes a cover disposed around the brace structure.

8. The electronic equipment enclosure structure of claim 1, wherein each reinforced bracket assembly includes a brace structure, having at least an L-shaped cross-section that includes a first vertical portion that is interconnected to the end of the respective horizontal mounting rail and a second vertical portion, angled relative to the first vertical portion, that braces the first vertical portion against the respective side-to-side cross member.

9. The electronic equipment enclosure structure of claim 8, wherein the brace structure of each reinforced bracket assembly has a U-shaped cross-section that includes the first vertical portion, the second vertical portion, and a third vertical portion, wherein the third vertical portion is angled relative to the first vertical portion and braces the first vertical portion against the respective side-to-side cross member.

10. The electronic equipment enclosure structure of claim 9, wherein the second and third vertical portions of the brace structure each include a respective tab that extends through the side-to-side cross member.

11. The electronic equipment enclosure structure of claim 10, wherein each reinforced bracket assembly further includes a reinforcement plate, wherein the bulk of each respective brace structure is disposed on the opposite side of the side-to-side cross member from the reinforcement plate, and wherein the tabs of the brace structure extend through the side-to-side cross member and reside in slots in the respective reinforcement plate.

12. A frame structure for an electronic equipment enclosure, comprising:

(a) a front frame, including a first pair of vertical frame members, a first upper side-to-side cross member, and a first lower side-to-side cross member;

(b) a rear frame, including a second pair of vertical frame members, a second upper side-to-side cross member, and a second lower side-to-side cross member;

(c) a plurality of front-to-back horizontal members, including first, second, third, and fourth horizontal members, wherein:

(i) each front-to-back horizontal member is a frame member, a horizontal mounting rail, or a combination frame member/horizontal mounting rail, (ii) each horizontal member has a proximal end and a distal end, and (iii) each horizontal member is made of extruded metal; and (d) a plurality of brace structures, each having a U-shaped cross-section that includes center and side vertical portions, the side vertical portions being right-angled relative to the center vertical portion;

(e) wherein the first and second horizontal members are interconnected at their proximal ends to the upper side-to-side cross member of the front frame and at their distal ends to the upper side-to-side cross member of the rear frame, and wherein the third and fourth horizontal members are interconnected at their proximal ends to the lower side-to-side cross member of the front frame and at their distal ends to the lower side-to-side cross member of the rear frame; and (f) wherein each interconnection of an end of a horizontal member with a side-to-side cross member is reinforced by a respective brace structure such that the center vertical portion of the brace structure is interconnected to the end of the respective horizontal members and the side vertical portions of the brace structure are arranged to brace the center vertical portion against the respective side-to-side cross member.

13. The frame structure of claim 12, wherein each end of each horizontal member includes an end surface that matches the cross-section of the extrusion of the horizontal member, and wherein the side-to-side cross members and brace structures are interconnected with the end surfaces of the horizontal members.

14. The frame structure of claim 13, wherein the side vertical portions of each brace structure each include a respective tab that extends through the respective side-to-side cross member.

15. The frame structure of claim 14, further comprising a plurality of reinforcement plates, each corresponding to a respective brace structure, wherein the bulk of each respective brace structure is disposed on the opposite side of the side-to-side cross member from the reinforcement plate, and wherein the tabs of each brace structure extend through the side-to-side cross member and reside in slots in the respective reinforcement plate.

16. The frame structure of claim 14, wherein the side vertical portions of each brace structure also press against the respective side-to-side cross member.

17. A frame structure for an electronic equipment enclosure, comprising:
(a) a front frame, including a first pair of vertical frame members, a first upper side-to-side cross member, and a first lower side-to-side cross member;
(b) a rear frame, including a second pair of vertical frame members, a second upper side-to-side cross member, and a second lower side-to-side cross member;
(c) a plurality of front-to-back horizontal members, including first, second, third, and fourth horizontal members, wherein:
(i) each front-to-back horizontal member is a frame member, a horizontal mounting rail, or a combination frame member/horizontal mounting rail,
(ii) each horizontal member has a proximal end and a distal end, and
(iii) each horizontal member is made of extruded metal and has an extruded slot running along its longitudinal axis; and
(d) a plurality of brace structures, wherein each brace structure is manufactured separately from the front-to-back horizontal members and the side-to-side cross members;
(e) wherein each side-to-side cross member includes opposed ends and first and second integral tabs, the tabs extending vertically from the cross member at locations that are spaced inwardly from the opposed ends thereof; and
(f) wherein:
(i) the first and second horizontal members are interconnected at their proximal ends to the integral tabs on the upper side-to-side cross member of the front frame and at their distal ends to the integral tabs on the upper side-to-side cross member of the rear frame,
(ii) the third and fourth horizontal mounting rails are interconnected at their proximal ends to the integral tabs on the lower side-to-side cross member of the front frame and at their distal ends to the integral tabs on the lower side-to-side cross member of the rear frame,
(iii) each interconnection of a horizontal member end to a tab on a side-to-side cross member is at least partially facilitated by a fastener extending through the tab and connecting to the extruded slot of the horizontal mounting rail, and
(iv) each interconnection of a horizontal member end to a tab on a side-to-side cross member is reinforced by a respective brace structure.

18. The frame structure of claim 17, wherein each end of each horizontal member includes an end surface that matches the cross-section of the extrusion of the horizontal member, and wherein the side-to-side cross members and brace structures are interconnected with the end surfaces of the horizontal members.

19. The frame structure of claim 18, wherein each brace structure includes a first vertical portion that is disposed between the respective tab and the end surface of the respective horizontal mounting rail.

20. The frame structure of claim 18, wherein the slot is a cylindrical slot and the fastener is threaded into the cylindrical slot.

* * * * *